(12) United States Patent
Shen et al.

(10) Patent No.: US 10,313,054 B2
(45) Date of Patent: *Jun. 4, 2019

(54) LOW DENSITY PARITY CHECK (LDPC) CODES FOR COMMUNICATION DEVICES AND SYSTEMS

(71) Applicant: BROADCOM CORPORATION, Irvine, CA (US)

(72) Inventors: Ba-Zhong Shen, Irvine, CA (US); Matthias Korb, Mission Viejo, CA (US); Andrew John Blanksby, Lake Oswego, OR (US); Ron Porat, San Diego, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 26 days.

This patent is subject to a terminal disclaimer.

(21) Appl. No.: 14/979,885

(22) Filed: Dec. 28, 2015

(65) Prior Publication Data

US 2016/0211941 A1 Jul. 21, 2016

Related U.S. Application Data

(60) Provisional application No. 62/100,872, filed on Jan. 7, 2015, provisional application No. 62/265,769, filed on Dec. 10, 2015.

(51) Int. Cl.
*H03M 13/00* (2006.01)
*H04L 1/00* (2006.01)
(Continued)

(52) U.S. Cl.
CPC ........ *H04L 1/0041* (2013.01); *H03M 13/036* (2013.01); *H03M 13/116* (2013.01);
(Continued)

(58) Field of Classification Search
CPC ..... G06F 11/00; H03M 13/00; H03M 13/036; H03M 13/05; H03M 13/11; H03M 13/1137; H03M 13/116; H03M 13/1185; H03M 13/616; H03M 13/618; H03M 13/6362; H04L 1/00; H04L 1/0041; H04L 1/0057; H04L 1/0069; H04L 1/1177
See application file for complete search history.

(56) References Cited

U.S. PATENT DOCUMENTS 9,203,435 B2 * 12/2015 Prodan ................. H03M 13/116
2003/0033575 A1 * 2/2003 Richardson .............. G06N 3/02
714/799

(Continued)

*Primary Examiner* — Albert Decady
*Assistant Examiner* — Enamul M Kabir
(74) *Attorney, Agent, or Firm* — Garlick & Markison; Edward J. Marshall

(57) ABSTRACT

A communication device (alternatively, device) includes a processor configured to support communications with other communication device(s) and to generate and process signals for such communications. In some examples, the device includes a communication interface and a processor, among other possible circuitries, components, elements, etc. to support communications with other communication device(s) and to generate and process signals for such communications. In some examples, a device encodes information using a low density parity check (LDPC) code to generate an LDPC coded signal and transmits the LDPC coded signal to another communication device. in other examples, a device receives an LDPC coded signal from another communication device and decodes the LDPC coded signal using an LDPC matrix. The LDPC matrix includes a left hand side matrix and a right hand side matrix (e.g., having CSI (Cyclic Shifted Identity) sub-matrices on a main diagonal and another diagonal adjacently located to the main diagonal).

20 Claims, 10 Drawing Sheets

(51) Int. Cl.
*H03M 13/03* (2006.01)
*H03M 13/11* (2006.01)

(52) U.S. Cl.
CPC .... *H03M 13/1137* (2013.01); *H03M 13/1185* (2013.01); *H03M 13/618* (2013.01); *H03M 13/6362* (2013.01); *H04L 1/0057* (2013.01); *H04L 1/0069* (2013.01)

(56) References Cited

U.S. PATENT DOCUMENTS

| | | | | |
|---|---|---|---|---|
| 2006/0156206 | A1* | 7/2006 | Shen | H03M 13/1148 714/784 |
| 2008/0072122 | A1* | 3/2008 | Nimbalker | H03M 13/114 714/774 |
| 2009/0327847 | A1* | 12/2009 | Shen | H03M 13/1151 714/804 |
| 2010/0251064 | A1* | 9/2010 | Shen | H03M 13/033 714/752 |
| 2010/0287438 | A1* | 11/2010 | Lakkis | H03M 13/112 714/752 |
| 2010/0287440 | A1* | 11/2010 | Alrod | G06F 11/1068 714/752 |
| 2010/0325511 | A1* | 12/2010 | Oh | H03M 13/116 714/752 |
| 2014/0337682 | A1* | 11/2014 | Prodan | H03M 13/116 714/755 |
| 2015/0089320 | A1* | 3/2015 | Jeong | H03M 13/255 714/758 |
| 2016/0087648 | A1* | 3/2016 | Korb | H03M 13/1105 714/752 |

* cited by examiner

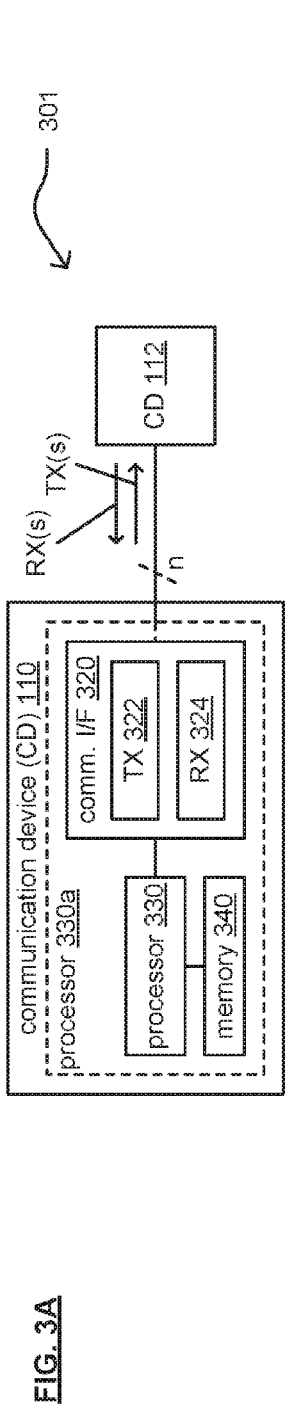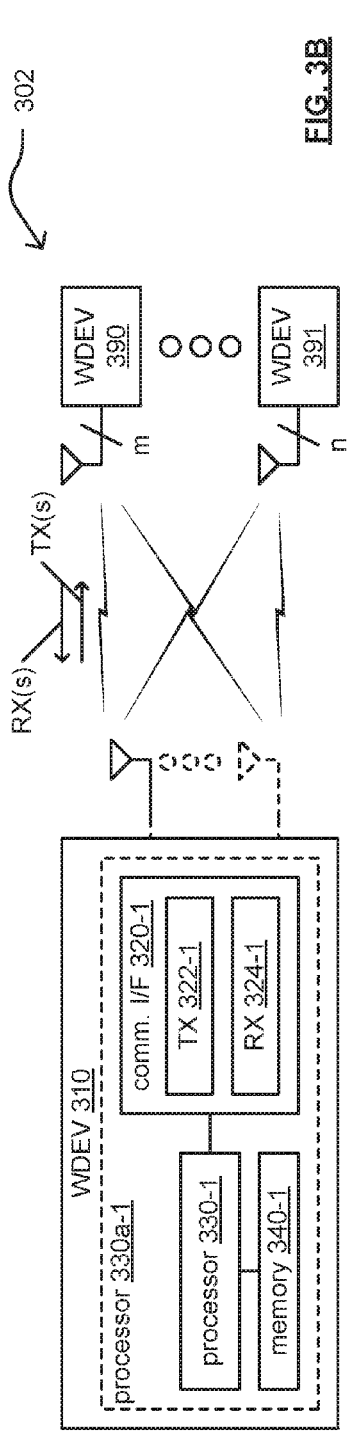

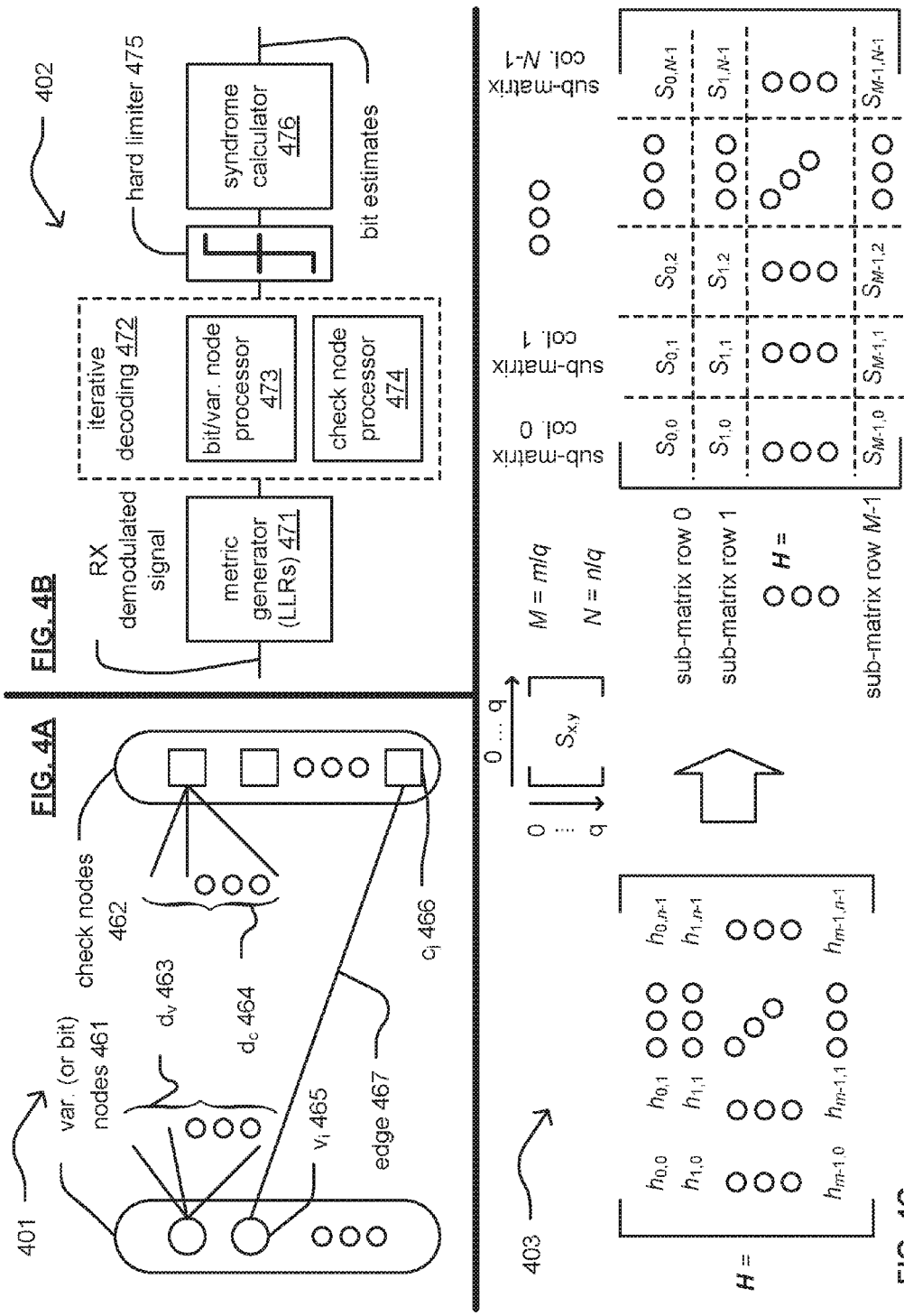

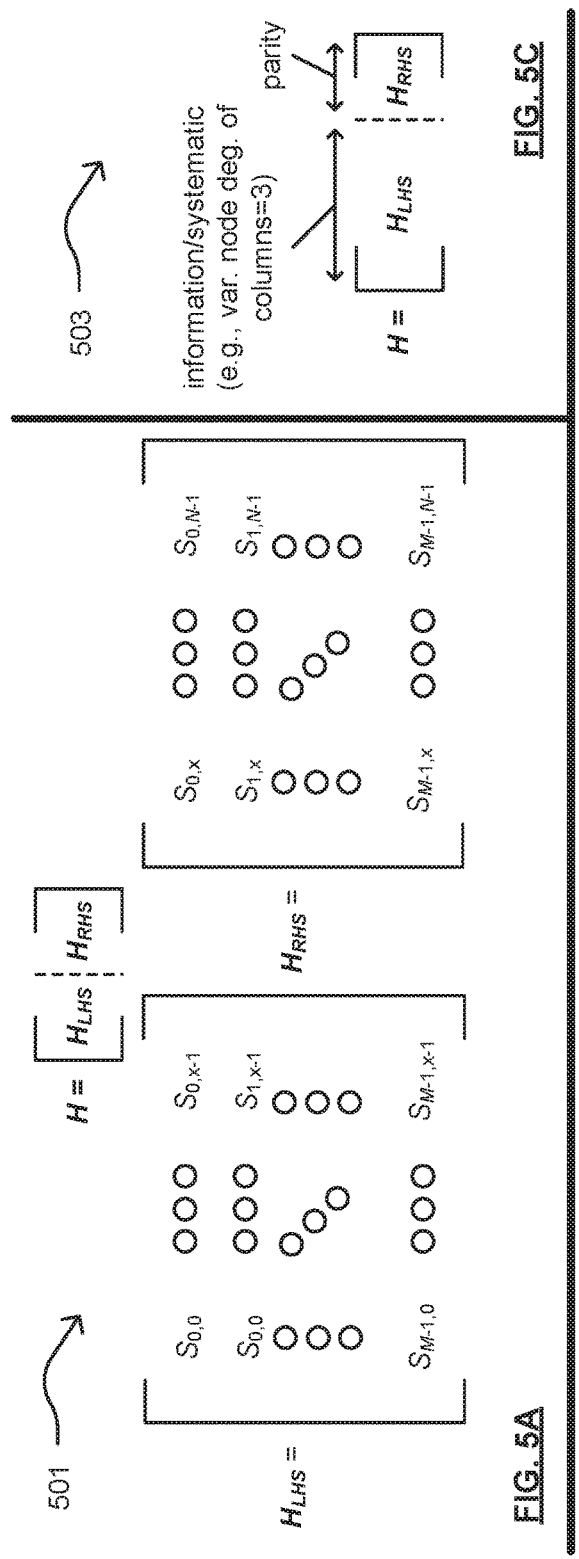
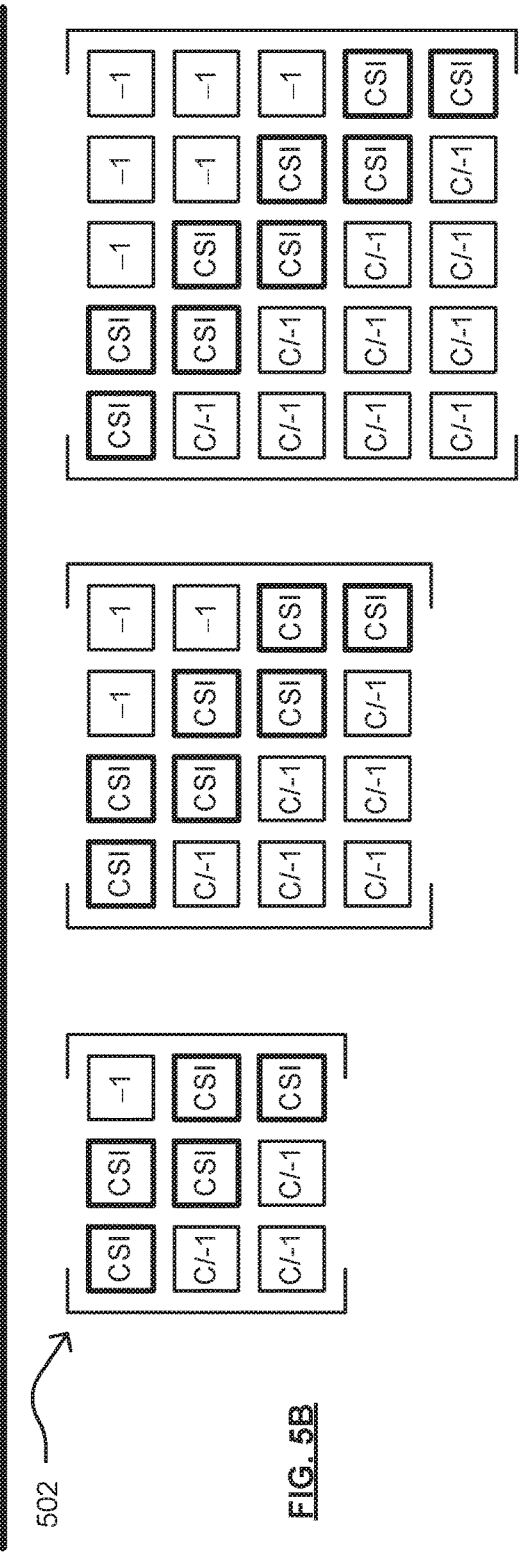
FIG. 5A
FIG. 5B
FIG. 5C

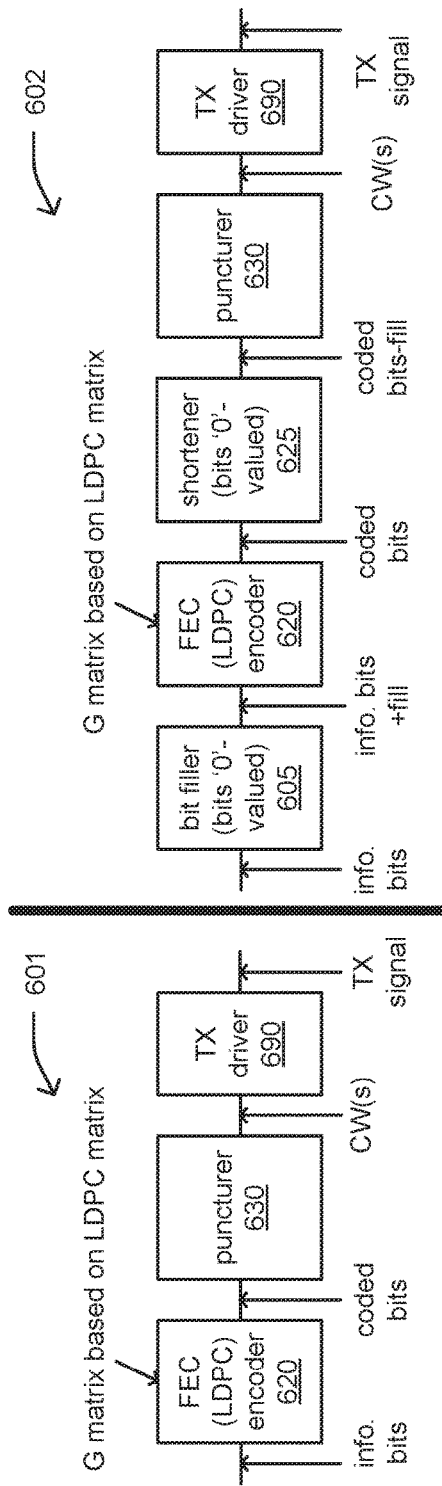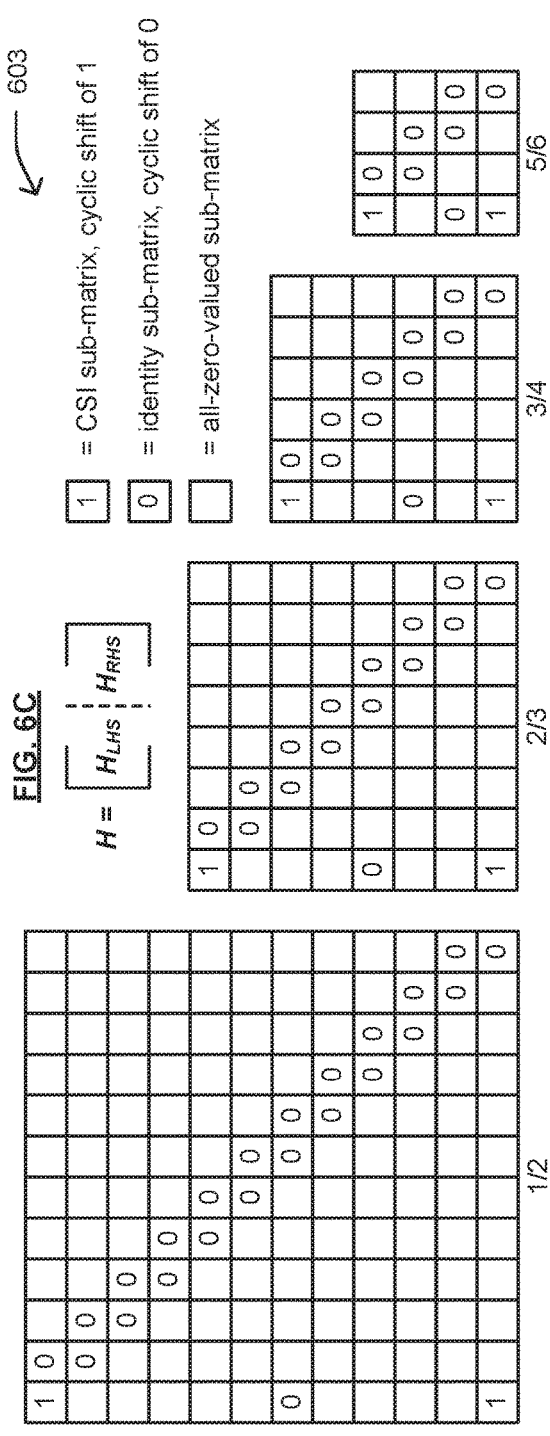

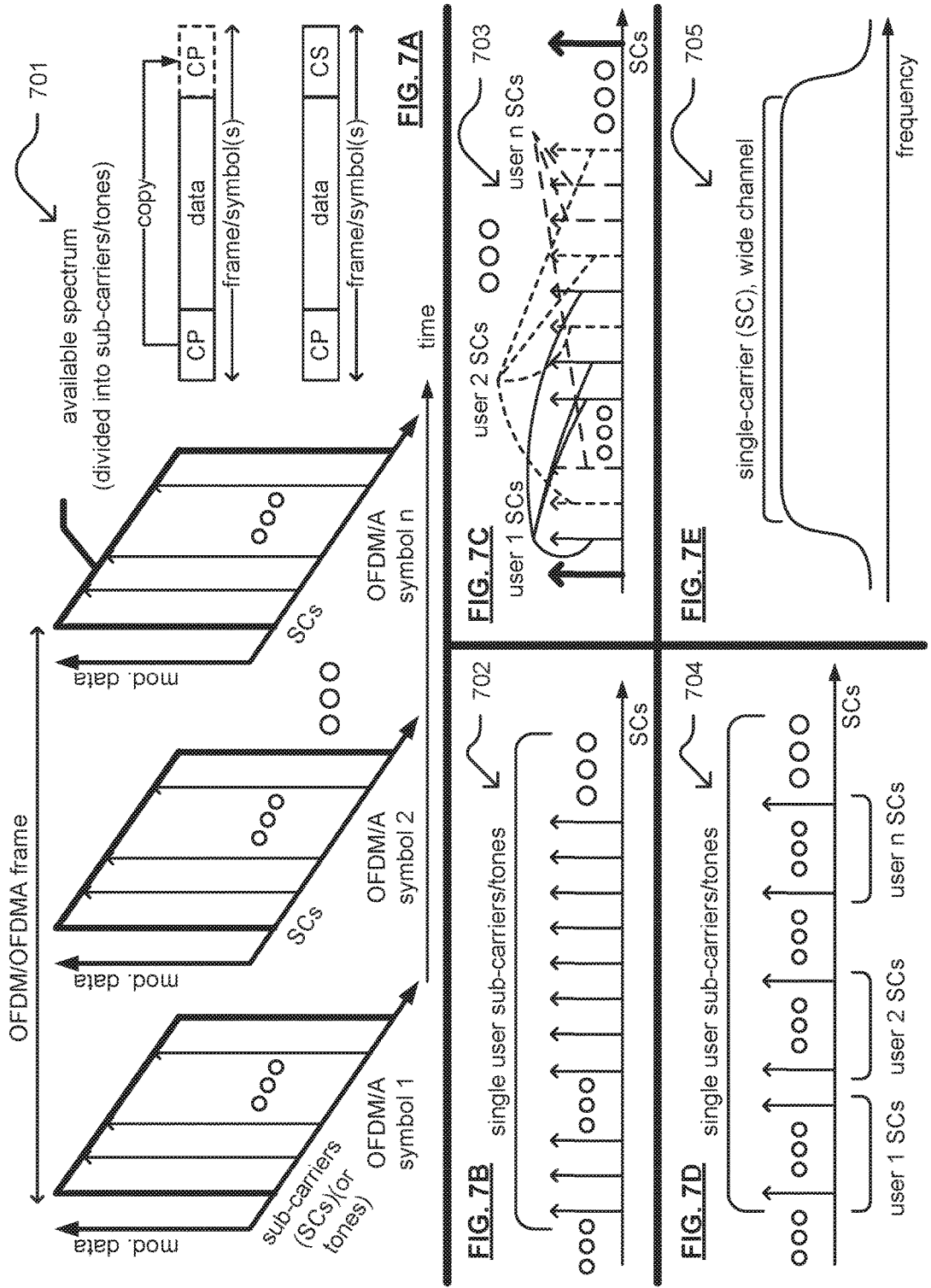

$$H = \begin{bmatrix} H_{LHS} & | & H_{RHS} \end{bmatrix}$$

800 →

$$H1 = \begin{bmatrix} 45,39,52,61,54,45,25,10,75, & 6, & 0,35,30,38,65,51,55,50,77,26,38, & 1, & 0,-1 \\ 0,25,54, & 0,79, & 5,48,20,13,61,74,29,36,49,46,63,68,66,67,30,67, & 0, & 0, & 0 \\ 8,29,49,31,25,17,73,19,33,66,61,12,18,70,48,25, & 0, & 3,61,22, & 3, & 1,-1, & 0 \end{bmatrix}$$

- 1944 block size code, R=7/8, (LF=81, 81×81 sub-matrices), 43 6-cycle 1, 24 sub-matrix columns, 3 sub-matrix rows $$H2 = \begin{bmatrix} 14,38,47,43, & 3,45, & 2,43, & 0,34, & 5,15,16,26,52, & 4,23,43,36,42,50, & 1, & 0,-1 \\ 34,48, & 5,51,49,33, & 8,27,14,36,45, & 8,37, & 3,46,33,24,16, & 4,45,37, & 0, & 0, & 0 \\ 12,29,27,40,10,51, & 6,36,31, & 6,19, & 4,48, & 5,22,41, & 4, & 4,23,27, & 9, & 1,-1, & 0 \end{bmatrix}$$

- 1296 block size code, R=7/8, (LF=54, 54×54 sub-matrices), 133 6-cycle 1, 24 sub-matrix columns, 3 sub-matrix rows $$H3 = \begin{bmatrix} 19, & 3,18, & 3,15,23, & 6,20,15,16, & 2, & 0, & 7,16,18,18, & 3,22, & 4,15, & 2, & 1, & 0,-1 \\ 22,22, & 7,24,25,10,24, & 0,12,11, & 0, & 6,11, & 2, & 2,14, & 8,10, & 6, & 5,10, & 0, & 0, & 0 \\ 7,25,21, & 7,11,25,17, & 6, & 6, & 3,23,24,15, & 9, & 1,23,10,21,23, & 0, & 8, & 1,-1, & 0 \end{bmatrix}$$

- 648 block size code, R=7/8, (LF=27, 27×27 sub-matrices), 400 6-cycle 9, 24 sub-matrix columns, 3 sub-matrix rows $$H4 = \begin{bmatrix} 58 & 67 & 58 & 11 & 30 & 16 & 0 & 59 & 41 & 5 & 56 & 43 & 50 & 60 & 54 & 61 & 19 & 0 & 26 & 39 & 7 & 1 & 0 & - \\ 41 & 14 & 43 & 6 & 4 & 38 & 48 & 70 & 56 & 57 & 77 & 32 & 1 & 78 & 61 & 29 & 46 & 28 & 18 & 47 & 58 & 0 & 0 & 0 \\ 23 & 76 & 28 & 26 & 49 & 49 & 36 & 48 & 51 & 12 & 60 & 41 & 7 & 19 & 35 & 1 & 5 & 12 & 22 & 1 & 79 & 1 & - & 0 \end{bmatrix}$$

- 1944 block size code, R=7/8, (LF=81, 81×81 sub-matrices), 24 sub-matrix columns, 3 sub-matrix rows

FIG. 8

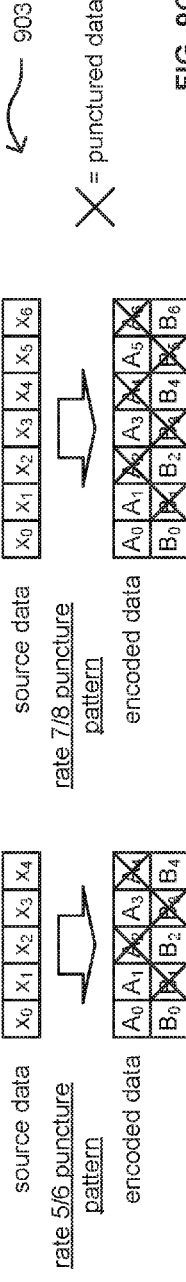

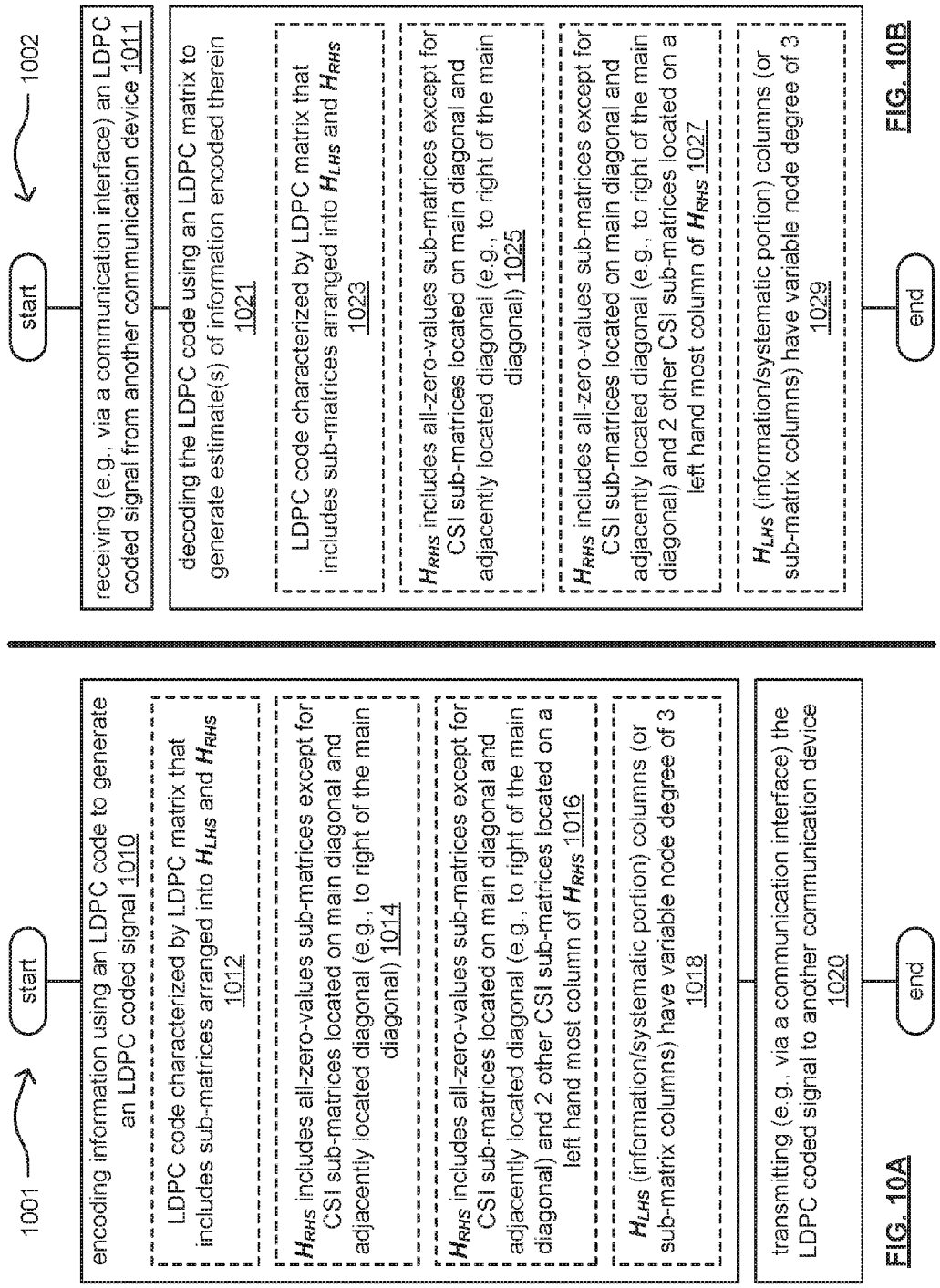

LOW DENSITY PARITY CHECK (LDPC) CODES FOR COMMUNICATION DEVICES AND SYSTEMS

CROSS REFERENCE TO RELATED PATENTS/PATENT APPLICATIONS

Provisional Priority Claims

The present U.S. Utility Patent Application claims priority pursuant to 35 U.S.C. § 119(e) to U.S. Provisional Application No. 62/100,872, entitled "Low density parity check (LDPC) codes for wireless communications," filed Jan. 7, 2015; and U.S. Provisional Application No. 62/265,769, entitled "Low density parity check (LDPC) codes for communication devices and systems," filed Dec. 10, 2015, both of which are hereby incorporated herein by reference in their entirety and made part of the present U.S. Utility Patent Application for all purposes.

BACKGROUND

Technical Field

The present disclosure relates generally to communication systems; and, more particularly, to communication devices operative and operable within such communication systems.

Description of Related Art

Data communication systems have been under continual development for many years. The primary goal within such communication systems is to transmit information successfully between devices. Unfortunately, many things can deleteriously affect signals transmitted within such systems resulting in degradation of or even complete failure of communication. Examples of adverse effects include interference and noise that may be caused by various sources including other communications, low-quality links, degraded or corrupted interfaces and connectors, etc.

Some communication systems use forward error correction (FEC) coding and/or error checking and correction (ECC) coding to increase the reliability and the amount of information that may be transmitted between devices. When a signal incurs one or more errors during transmission, a receiver device can employ the FEC or ECC coding to try to correct those one or more errors.

A continual and primary directive in this area of development has been to try continually to lower the signal to noise ratio (SNR) required to achieve a given bit error ratio (BER) or symbol error ratio (SER) within a communication system. The Shannon limit is the theoretical bound for channel capacity for a given modulation and code rate. The ideal goal has been to try to reach Shannon's channel capacity limit in a communication channel. Shannon's limit may be viewed as being the maximum data rate per unit of bandwidth (i.e., spectral efficiency) to be used in a communication channel, having a particular SNR, where transmission through the communication channel with arbitrarily low BER or SER is achievable.

In addition, communication systems may be configured to support wireless and wire lined communications between wireless and/or wire lined communication devices. The systems can range from national and/or international cellular telephone systems, to the Internet, to point-to-point in-home wireless networks and can operate in accordance with one or more communication standards. For example, wireless communication systems may operate in accordance with one or more standards including, but not limited to, IEEE 802.11x (where x may be various extensions such as a, b, n, g, etc.), Bluetooth, advanced mobile phone services (AMPS), digital AMPS, global system for mobile communications (GSM), etc., and/or variations thereof.

In some instances, wireless communication is made between a transmitter (TX) and receiver (RX) using single-input-single-output (SISO) communication. Another type of wireless communication is single-input-multiple-output (SIMO) in which a single TX processes data into radio frequency (RF) signals that are transmitted to a RX that includes two or more antennae and two or more RX paths.

Yet an alternative type of wireless communication is multiple-input-single-output (MISO) in which a TX includes two or more transmission paths that each respectively converts a corresponding portion of baseband signals into RF signals, which are transmitted via corresponding antennae to a RX. Another type of wireless communication is multiple-input-multiple-output (MIMO) in which a TX and RX each respectively includes multiple paths such that a TX parallel processes data using a spatial and time encoding function to produce two or more streams of data and a RX receives the multiple RF signals via multiple RX paths that recapture the streams of data utilizing a spatial and time decoding function.

There continues to be significant room in the art for improvement of increasing performance along these lines including increasing throughput, performance, etc. within such communication devices and systems.

BRIEF DESCRIPTION OF THE SEVERAL VIEWS OF THE DRAWINGS

FIG. 3A is a diagram illustrating an example of a communication device operative within one or more communication systems.

FIG. 3B is a diagram illustrating an example of communication between wireless communication devices.

FIG. 3C is a diagram illustrating an example of communication between communication devices.

FIG. 3D is a diagram illustrating an example of communication between wireless communication devices.

FIG. 4A illustrates an example of an LDPC (Low Density Parity Check) code bipartite graph.

FIG. 4B illustrates an example of decoding of an LDPC coded signal.

FIG. 4C illustrates an example of an LDPC matrix that is partitioned into sub-matrices.

FIG. 5A is a diagram illustrating an example of an LDPC matrix partitioned into a left hand side matrix and a right hand side matrix.

FIG. 5B is a diagram illustrating examples of right hand side matrices of LDPC matrices.

FIG. 5C is a diagram illustrating another example of an LDPC matrix partitioned into a left hand side matrix and a right hand side matrix.

FIG. 6A is a diagram illustrating an example of a communication device configured to perform LDPC encoding and puncturing.

FIG. 6B is a diagram illustrating an example of a communication device configured to perform bit filling, LDPC encoding, shortening, and puncturing.

FIG. 6C is a diagram illustrating examples of right hand side matrices of LDPC matrices.

FIG. 7A is a diagram illustrating an example of orthogonal frequency division multiplexing (OFDM) and/or orthogonal frequency division multiple access (OFDMA).

FIG. 7B is a diagram illustrating another example of OFDM and/or OFDMA.

FIG. 7C is a diagram illustrating another example of OFDM and/or OFDMA.

FIG. 7D is a diagram illustrating another example of OFDM and/or OFDMA.

FIG. 7E is a diagram illustrating an example of single-carrier (SC) signaling.

FIG. 8 is a diagram illustrating various examples of LDPC matrices.

FIG. 9A is a diagram illustrating another example of an LDPC matrix.

FIG. 9B is a diagram illustrating another example of an LDPC matrix.

FIG. 9C is a diagram illustrating examples of various puncturing patterns.

FIG. 10A is a diagram illustrating an embodiment of a method for execution by one or more communication devices.

FIG. 10B is a diagram illustrating another embodiment of a method for execution by one or more communication devices.

DETAILED DESCRIPTION

Figure 1A:
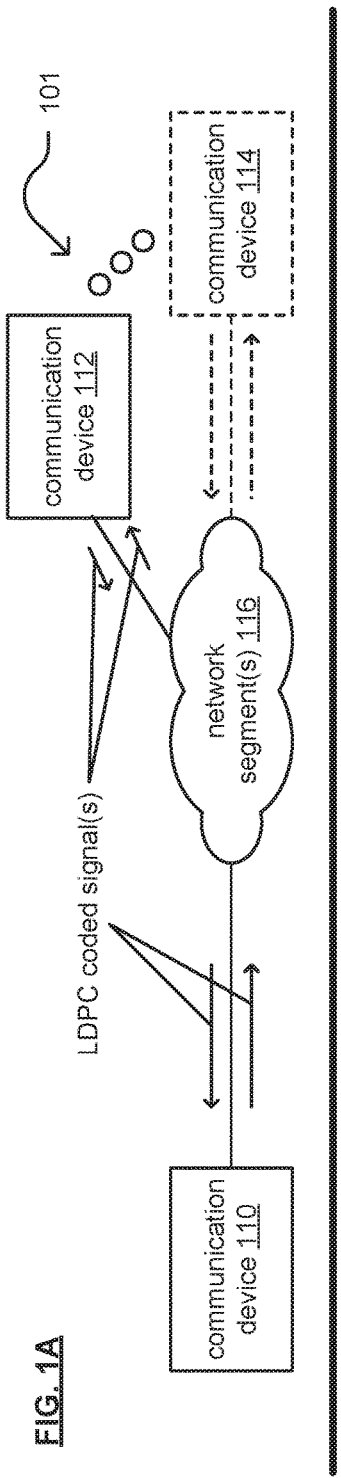
FIG. 1A is a diagram illustrating an embodiment of one or more communication systems.

FIG. 1A is a diagram illustrating an embodiment 101 of one or more communication systems. One or more network segments 116 provide communication inter-connectivity for at least two communication devices 110 and 112 (also referred to as communication devices in certain locations in the diagrams). Note that general reference to a communication device may be made generally herein using the term 'device' (e.g., device 110 or CD 110 when referring to communication device 110, or devices 110 and 112, or CDs 110 and 112, when referring to communication devices 110 and 112; note that CD is used in certain diagrams for brevity). Such references may be applicable with respect to any type of communication device operative within any type of communication system (e.g., wireless, wired, satellite, optical, and/or other type of system). Generally speaking, any desired number of communication devices are included within one or more communication systems (e.g., as shown by communication device 114). The details of an embodiment of such devices including those operative within this embodiment 101 are described in greater detail with reference to FIG. 3A among other diagrams.

The various communication links within the one or more network segments 116 may be implemented using any of a variety of communication media including communication links implemented as wireless, wired, optical, satellite, microwave, and/or any combination thereof, etc. communication links. Also, in some instances, communication links of different types may cooperatively form a connection pathway between any two communication devices. Considering one possible example, a communication pathway between devices 110 and 112 may include some segments of wired communication links and other segments of optical communication links. Note also that the devices 110-114 may be of a variety of types of devices including stationary devices, mobile devices, portable devices, etc. and may support communications for any of a number of services or service flows including data, telephony, television, Internet, media, synchronization, etc.

In an example of implementation, device 110 includes a communication interface to support communications with one or more of the other devices 112-114. This communication may be bidirectional/to and from the one or more of the other devices 112-114 or unidirectional (or primarily unidirectional) from the one or more of the other devices 112-114.

In another example of implementation, device 110 includes a communication interface and/or a processor (and possibly other possible circuitries, components, elements, etc.) to support communications with other device(s) and to generate and process signals for such communications. The communication interface and/or the processor operate to perform various operations and functions to effectuate such communications.

In an example of operation, one of the devices, such as device 110, includes a communication interface and/or a processor that operate to support communications with another device, such as device 112, among others within the system. For example, the processor is operative to generate and interpret different signals, frames, packets, symbols, etc. for transmission to other devices and that have been received from other devices.

In an example, a device (e.g., such as device 110) includes a communication interface and/or a processor (and possibly other possible circuitries, components, elements, etc.) to support communications with other device(s) and to generate and process signals for such communications. The communication interface and/or the processor operate to perform various operations and functions to effectuate such communications (e.g., the communication interface and the processor may be configured to perform certain operation(s) in conjunction with one another, cooperatively, dependently with one another, etc. and other operation(s) separately, independently from one another, etc.). In some examples, such a processor includes all capability, functionality, and/or circuitry, etc. to perform such operations as described herein. In some other examples, such a communication interface includes all capability, functionality, and/or circuitry, etc. to perform such operations as described herein. In even other examples, such a processor and a communication interface include all capability, functionality, and/or circuitry, etc. to perform such operations as described herein, at least in part, cooperatively with one another.

In an example of operation, device 110 encodes information using a low density parity check (LDPC) code to generate an LDPC coded signal and transmits the LDPC coded signal to another communication device (e.g., device 112 and/or device 114). In another example of operation, device 110 receives an LDPC coded signal from another communication device (e.g., device 112 or device 114) and decodes the LDPC coded signal using an LDPC matrix. In some examples, the LDPC code is characterized by an LDPC matrix that includes sub-matrices arranged as a left hand side matrix and a right hand side matrix. In some examples, the right hand side matrix includes all-zero-valued sub-matrices except for CSI (Cyclic Shifted Identity) sub-matrices located on a main diagonal of the right hand side matrix and another diagonal that is adjacently located to right of the main diagonal of the right hand side matrix. In other examples, the right hand side matrix includes all-zero-valued sub-matrices except for CSI sub-matrices located on a main diagonal of the right hand side matrix and another diagonal that is adjacently located to right of the main diagonal of the right hand side matrix and two other CSI sub-matrices located on a left hand most column of the right hand side matrix. In some examples, the variable node degree of columns (e.g., columns or sub-matrix columns) of the left hand side matrix is 3.

Figure 1B:
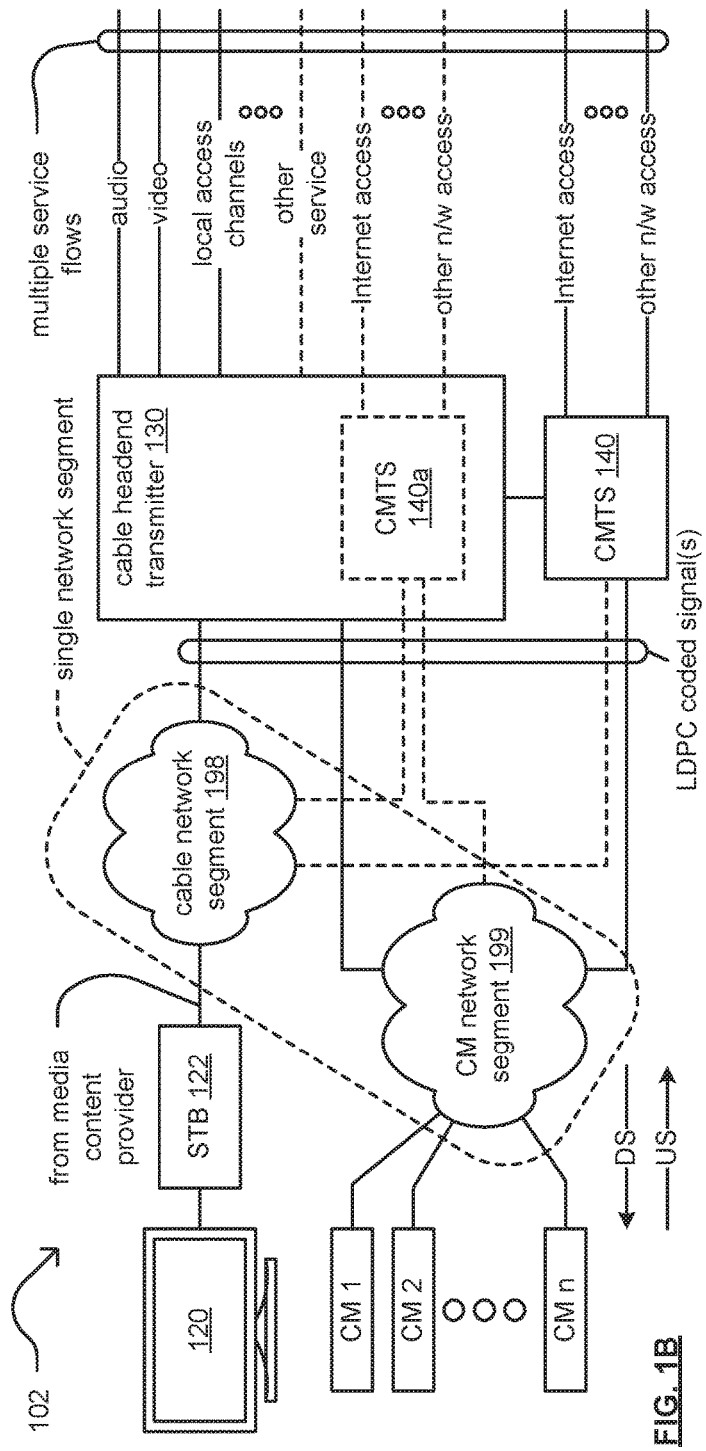
FIG. 1B is a diagram illustrating another embodiment of one or more communication systems.

FIG. 1B is a diagram illustrating another embodiment 102 of one or more communication systems. A cable headend transmitter 130 provides service to a set-top box (STB) 122 via cable network segment 198. The STB 122 provides output to a display capable device 120. The cable headend transmitter 130 can support any of a number of service flows such as audio, video, local access channels, as well as any other service of cable systems. For example, the cable headend transmitter 130 can provide media (e.g., video and/or audio) to the display capable device.

The cable headend transmitter 130 may provide operation of a cable modem termination system (CMTS) 140a. For example, the cable headend transmitter 130 may perform such CMTS functionality, or a CMTS may be implemented separately from the cable headend transmitter 130 (e.g., as shown by reference numeral 140). The CMTS 140 can provide network service (e.g., Internet, other network access, etc.) to any number of cable modems (shown as CM 1, CM 2, and up to CM n) via a cable modem (CM) network segment 199. The cable network segment 198 and the CM network segment 199 may be part of a common network or common networks. The cable modem network segment 199 couples the cable modems 1-n to the CMTS (shown as 140 or 140a). Such a cable system (e.g., cable network segment 198 and/or CM network segment 199) may generally be referred to as a cable plant and may be implemented, at least in part, as a hybrid fiber-coaxial (HFC) network (e.g., including various wired and/or optical fiber communication segments, light sources, light or photo detection components, etc.).

A CMTS 140 (or 140a) is a component that exchanges digital signals with cable modems 1-n on the cable modem network segment 199. Each of the cable modems is coupled to the cable modem network segment 199, and a number of elements may be included within the cable modem network segment 199. For example, routers, splitters, couplers, relays, and amplifiers may be contained within the cable modem network segment 199. Generally speaking, downstream information may be viewed as that which flows from the CMTS 140 to the connected cable modems (e.g., CM 1, CM2, etc.), and upstream information as that which flows from the cable modems to the CMTS 140.

In an example of operation, CM 1 encodes information using a LDPC code to generate an LDPC coded signal and transmits the LDPC coded signal to CMTS 140 (or 140a). In another example of operation, CM 1 receives an LDPC coded signal from CMTS 140 (or 140a) and decodes the LDPC coded signal using an LDPC matrix. In an example of operation, CMTS 140 (or 140a encodes information using a low density parity check (LDPC) code to generate an LDPC coded signal and transmits the LDPC coded signal to CM 2. In another example of operation, CMTS 140 (or 140a) receives an LDPC coded signal from CM 2 and decodes the LDPC coded signal using an LDPC matrix.

Figure 2:
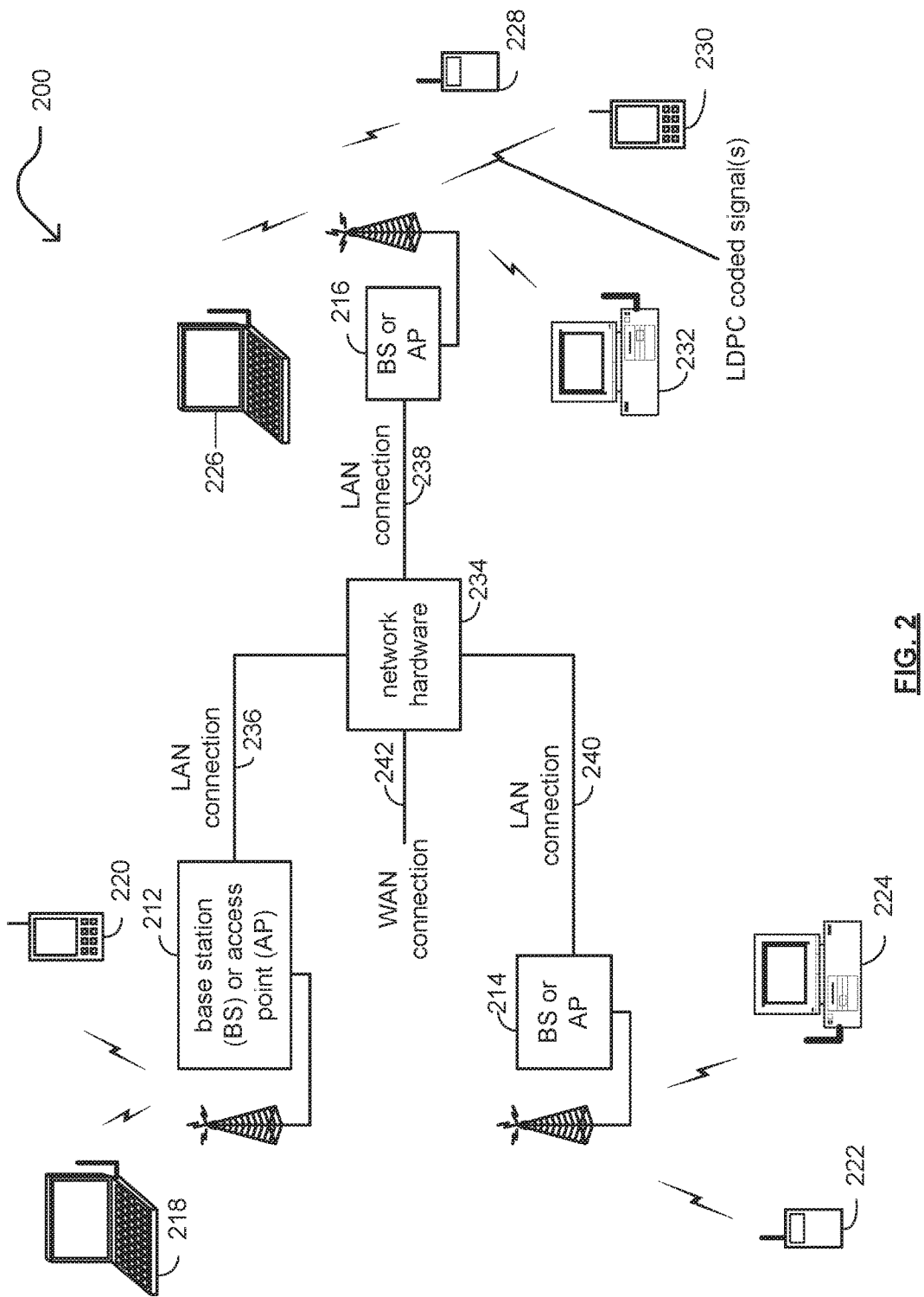
FIG. 2 is a diagram illustrating an embodiment of a wireless communication system.

FIG. 2 is a diagram illustrating an embodiment of a wireless communication system 200. The wireless communication system 200 includes base stations and/or access points 212-216, wireless communication devices 218-232 (e.g., wireless stations (STAs)), and a network hardware component 234. The wireless communication devices 218-232 may be laptop computers, or tablets, 218 and 226, personal digital assistants 220 and 230, personal computers 224 and 232 and/or cellular telephones 222 and 228. Other examples of such wireless communication devices 218-232 could also or alternatively include other types of devices that include wireless communication capability. The details of an embodiment of such wireless communication devices including those operative within this embodiment 200 are described in greater detail with reference to FIG. 3B among other diagrams.

Some examples of possible devices that may be implemented to operate in accordance with any of the various examples, embodiments, options, and/or their equivalents, etc. described herein may include, but are not limited by, appliances within homes, businesses, etc. such as refrigerators, microwaves, heaters, heating systems, air conditioners, air conditioning systems, lighting control systems, and/or any other types of appliances, etc.; meters such as for natural gas service, electrical service, water service, Internet service, cable and/or satellite television service, and/or any other types of metering purposes, etc.; devices wearable on a user or person including watches, monitors such as those that monitor activity level, bodily functions such as heartbeat, breathing, bodily activity, bodily motion or lack thereof, etc.; medical devices including intravenous (IV) medicine delivery monitoring and/or controlling devices, blood monitoring devices (e.g., glucose monitoring devices) and/or any other types of medical devices, etc.; premises monitoring devices such as movement detection/monitoring devices, door closed/ajar detection/monitoring devices, security/alarm system monitoring devices, and/or any other type of premises monitoring devices; multimedia devices including televisions, computers, audio playback devices, video playback devices, and/or any other type of multimedia devices, etc.; and/or generally any other type(s) of device(s) that include(s) wireless communication capability, functionality, circuitry, etc. In general, any device that is implemented to support wireless communications may be implemented to operate in accordance with any of the various examples, embodiments, options, and/or their equivalents, etc. described herein.

This disclosure presents novel architectures, methods, approaches, etc. that allow for improved spatial re-use for next generation WiFi or wireless local area network (WLAN) systems. Next generation WiFi systems are expected to improve performance in dense deployments where many clients and APs are packed in a given area (e.g., which may be an area [indoor and/or outdoor] with a high density of devices, such as a train station, airport, stadium, building, shopping mall, arenas, convention centers, colleges, downtown city centers, etc. to name just some examples). Large numbers of devices operating within a given area can be problematic if not impossible using prior technologies.

The base stations (BSs) or access points (APs) 212-216 are operably coupled to the network hardware 234 via local area network connections 236, 238, and 240. The network hardware 234, which may be a router, switch, bridge, modem, system controller, etc., provides a wide area network connection 242 for the communication system 200. Each of the base stations or access points 212-216 has an associated antenna or antenna array to communicate with the wireless communication devices in its area. Typically, the wireless communication devices register with a particular base station or access point 212-216 to receive services from the communication system 200. For direct connections (i.e., point-to-point communications), wireless communication devices communicate directly via an allocated channel.

Any of the various wireless communication devices (WDEVs) 218-232 and BSs or APs 212-216 may include a processor and/or a communication interface to support communications with any other of the wireless communication devices 218-232 and BSs or APs 212-216. In an example of operation, a processor and/or a communication interface implemented within one of the devices (e.g., any one of the WDEVs 218-232 and BSs or APs 212-216) is/are configured to process at least one signal received from and/or to generate at least one signal to be transmitted to another one of the devices (e.g., any other one of the WDEVs 218-232 and BSs or APs 212-216).

The processor and/or the communication interface of any one of the various devices, WDEVs 218-232 and BSs or APs 212-216, may be configured to support communications with any other of the various devices, WDEVs 218-232 and BSs or APs 212-216. Such communications may be uni-directional or bi-directional between devices. Also, such communications may be uni-directional between devices at one time and bi-directional between those devices at another time.

In an example, a device (e.g., any one of the WDEVs 218-232 and BSs or APs 212-216) includes a communication interface and/or a processor (and possibly other possible circuitries, components, elements, etc.) to support communications with other device(s) and to generate and process signals for such communications. The communication interface and/or the processor operate to perform various operations and functions to effectuate such communications (e.g., the communication interface and the processor may be configured to perform certain operation(s) in conjunction with one another, cooperatively, dependently with one another, etc. and other operation(s) separately, independently from one another, etc.). In some examples, such a processor includes all capability, functionality, and/or circuitry, etc. to perform such operations as described herein. In some other examples, such a communication interface includes all capability, functionality, and/or circuitry, etc. to perform such operations as described herein. In even other examples, such a processor and a communication interface include all capability, functionality, and/or circuitry, etc. to perform such operations as described herein, at least in part, cooperatively with one another.

In an example of operation, WDEV 230 encodes information using a LDPC code to generate an LDPC coded signal and transmits the LDPC coded signal to BS or AP 216. In another example of operation, WDEV 230 receives an LDPC coded signal from BS or AP 216 and decodes the LDPC coded signal using an LDPC matrix.

FIG. 3A is a diagram illustrating an example 301 of a communication device operative within one or more communication systems. The device 110 includes a communication interface 320 and a processor 330. The communication interface 320 includes functionality of a transmitter 322 and a receiver 324 to support communications with one or more other devices within a communication system. The device 110 may also include memory 340 to store information including one or more signals generated by the device 110 or such information received from other devices (e.g., device 112) via one or more communication channels. Memory 340 may also include and store various operational instructions for use by the processor 330 in regards to the processing of messages and/or other received signals and generation of other messages and/or other signals including those described herein. Memory 340 may also store information including one or more types of encoding, one or more types of symbol mapping, concatenation of various modulation coding schemes, etc. as may be generated by the device 110 or such information received from other devices via one or more communication channels. The communication interface 320 supports communications to and from one or more other devices (e.g., CD 112 and/or other communication devices). Operation of the communication interface 320 may be directed by the processor 330 such that processor 330 transmits and receives signals (TX(s) and RX(s)) via the communication interface 320.

Generally speaking, the communication interface 320 is implemented to perform any such operations of an analog front end (AFE) and/or physical layer (PHY) transmitter, receiver, and/or transceiver. Examples of such operations may include any one or more of various operations including conversions between the frequency and analog or continuous time domains (e.g., such as the operations performed by a digital to analog converter (DAC) and/or an analog to digital converter (ADC)), gain adjustment including scaling, filtering (e.g., in either the digital or analog domains), frequency conversion (e.g., such as frequency upscaling and or frequency downscaling, such as to a baseband frequency at which one or more of the components of the device 110 operates), equalization, pre-equalization, metric generation, symbol mapping and/or de-mapping, automatic gain control (AGC) operations, and/or any other operations that may be performed by an AFE and/or PHY component within a communication device.

Note that device 110 may be implemented to operate as any one or more of a satellite communication device, a wireless communication device, a wired communication device, a fiber-optic communication device, or a mobile communication device and implemented and/or operative within any one or more communication systems including a satellite communication system, a wireless communication system, a wired communication system, a fiber-optic communication system, or a mobile communication system.

Also, in some examples, note that one or more of the processor 330, the communication interface 320 (including the TX 322 and/or RX 324 thereof), and/or the memory 340 may be implemented in one or more "processing modules," "processing circuits," "processors," and/or "processing units". Considering one example, one processor 330a may be implemented to include the processor 330, the communication interface 320 (including the TX 322 and/or RX 324 thereof), and the memory 340. Considering another example, two or more processors may be implemented to include the processor 330, the communication interface 320 (including the TX 322 and/or RX 324 thereof), and the memory 340. In such examples, such a "processor" or "processors" is/are configured to perform various operations, functions, communications, etc. as described herein. In general, the various elements, components, etc. shown within the device 110 may be implemented in any number of "processing modules," "processing circuits," "processors," and/or "processing units" (e.g., 1, 2, . . . , and generally using N such "processing modules," "processing circuits," "processors," and/or "processing units", where N is a positive integer greater than or equal to 1).

FIG. 3B is a diagram illustrating an example 302 of communication between wireless communication devices. A wireless communication device 310 (e.g., which may be any one of devices 218-232 as with reference to FIG. 2) is in communication with another wireless communication device 390 via a transmission medium. The wireless communication device 310 includes a communication interface 320-1 to perform transmitting and receiving of at least one packet or frame (e.g., using a transmitter 322-1 and a receiver 324-1) (note that general reference to packet or frame may be used interchangeably).

Generally speaking, the communication interface 320-1 is implemented to perform any such operations of an analog front end (AFE) and/or physical layer (PHY) transmitter, receiver, and/or transceiver. Examples of such operations may include any one or more of various operations including conversions between the frequency and analog or continuous time domains (e.g., such as the operations performed by a digital to analog converter (DAC) and/or an analog to digital converter (ADC)), gain adjustment including scaling, filtering (e.g., in either the digital or analog domains), frequency conversion (e.g., such as frequency upscaling and/or frequency downscaling, such as to a baseband frequency at which one or more of the components of the device 310 operates), equalization, pre-equalization, metric generation, symbol mapping and/or de-mapping, automatic gain control (AGC) operations, and/or any other operations that may be performed by an AFE and/or PHY component within a wireless communication device.

In some implementations, the wireless communication device 310 also includes a processor 330-1, and an associated memory 340-1, to execute various operations including interpreting at least one signal, symbol, packet, and/or frame transmitted to wireless communication device 390 and/or received from the wireless communication device 390 and/or wireless communication device 391. The wireless communication devices 310 and 390 (and/or 391) may be implemented using at least one integrated circuit in accordance with any desired configuration or combination of components, modules, etc. within at least one integrated circuit. Also, the wireless communication devices 310, 390, and/or 391 may each include one or more antennas for transmitting and/or receiving of at least one packet or frame (e.g., WDEV 390 may include m antennae, and WDEV 391 may include n antennae).

Also, in some examples, note that one or more of the processor 330-1, the communication interface 320-1 (including the TX 322-1 and/or RX 324-1 thereof), and/or the memory 340-1 may be implemented in one or more "processing modules," "processing circuits," "processors," and/or "processing units". Considering one example, one processor 330a-1 may be implemented to include the processor 330-1, the communication interface 320-1 (including the TX 322-1 and/or RX 324-1 thereof), and the memory 340-1. Considering another example, two or more processors may be implemented to include the processor 330-1, the communication interface 320-1 (including the TX 322-1 and/or RX 324-1 thereof), and the memory 340-1. In such examples, such a "processor" or "processors" is/are configured to perform various operations, functions, communications, etc. as described herein. In general, the various elements, components, etc. shown within the device 310 may be implemented in any number of "processing modules," "processing circuits," "processors," and/or "processing units" (e.g., 1, 2, . . . , and generally using N such "processing modules," "processing circuits," "processors," and/or "processing units", where N is a positive integer greater than or equal to 1).

In some examples, the device 310 includes both processor 330-1 and communication interface 320-1 configured to perform various operations. In other examples, the device 310 includes processor 330a-1 configured to perform various operations. Generally, such operations include generating, transmitting, etc. signals intended for one or more other devices (e.g., device 390 through 391) and receiving, processing, etc. other signals received for one or more other devices (e.g., device 390 through 391).

The signals generated and transmitted (or received and processed) by the various devices of these diagrams FIG. 3A and FIG. 3B, among others, may be LDPC, orthogonal frequency division multiplexing (OFDM), orthogonal frequency division multiple access (OFDMA), etc. type signals.

wherein the plurality of CSI sub-matrices includes identity sub-matrices except for a first CSI sub-matrix with cyclic shift value of 1 that is located at a top of the main diagonal and a top of left hand most column of the right hand side matrix and a second CSI sub-matrix with cyclic shift value of 1 that is located at a bottom of the left hand most column of the right hand side matrix.

FIG. 3C is a diagram illustrating an example 303 of communication between communication devices. In an example of operation, the device 110 is configured to generate and transmit $1^{st}$ LDPC coded signal(s) to device 112, and the device 110 is configured to receive and process $2^{nd}$ LDPC coded signal(s) from the device 112 and to process those $2^{nd}$ LDPC coded signal(s).

FIG. 3D is a diagram illustrating an example 304 of communication between wireless communication devices. In an example of operation, the WDEV 310 is configured to generate and transmit $1^{st}$ LDPC coded signal(s) to WDEV 390, and the WDEV 310 is configured to receive and process $2^{nd}$ LDPC coded signal(s) from the WDEV 390 and to process those $2^{nd}$ LDPC coded signal(s).

The $1^{st}$ LDPC coded signal(s) and the $2^{nd}$ LDPC coded signal(s) of FIG. 3C and FIG. 3D maybe based on the same LDPC code or based on different LDPC codes.

FIG. 4A illustrates an example 401 of an LDPC (Low Density Parity Check) code bipartite graph. An LDPC bipartite graph is sometimes be referred to as a "Tanner" graph. An LDPC bipartite graph is a pictorial representation of an LDPC matrix of a corresponding LDPC code, and it shows the relationship of non-null elements of the LDPC matrix that performs bit or variable edge message updating (based on columns of the LDPC matrix) and check message updating (based on rows of the LDPC matrix). An LDPC code is characterized by a binary parity check matrix (i.e., LDPC matrix) that is sparse, such that nearly all of the elements of the matrix have values of zero ("0"). For example, $H=(h_{i,j})_{M \times N}$ is a parity check matrix of an LDPC code with block length N. The LDPC bipartite graph, or "Tanner" graph, is a pictorial illustration of an LDPC matrix.

LDPC codes are linear block codes and hence the set of all codewords $x \in C$ spans the null space of a parity check matrix, H, as follows:

$$Hx^T = 0, \forall x \in C \qquad (1)$$

For an LDPC code, the matrix, H, is a sparse binary matrix of dimension m×n. Each row of H corresponds to a parity check and a set element $h_{ij}$ indicates that data symbol j used for the parity check i. Each column of H corresponds to a codeword symbol.

For each codeword x, there are n symbols of which m are parity symbols. Hence the code rate of the LDPC code, r, is provided as follows:

$$r = (n-m)/n \qquad (2)$$

The row and column weights are defined as the number of set elements in a given row or column of H, respectively. The set elements of H are chosen to satisfy the performance requirements of the code. The number of 1's in the i-th column of the parity check matrix, H, may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v, d_c)$ regular LDPC code, otherwise the LDPC code is called an irregular LDPC code.

A regular LDPC code can be represented as a bipartite graph by its parity check matrix with left side nodes representing variable of the code bits (or alternatively as the "variable nodes" (or "bit nodes") 461 in a bit-based decoding of LDPC coded signals), and the right side nodes representing check equations (or alternatively as the "check nodes" 462). The bipartite graph (or Tanner graph) of the LDPC code defined by H may be defined by N variable nodes (e.g., N bit nodes) and M check nodes. Every variable node of the N variable nodes 461 has exactly $d_v(i)$ edges. As an example, edge 467 connects the bit node, $v_i$ 465, to one or more of the check nodes (within the M check nodes). The edge 467 is specifically shown as connecting from the bit node, $v_i$ 465, to the check node, $c_j$ 466. This number of edges (shown as 463) may be referred to as the degree of a variable node i. Analogously, a check node of the M check nodes 462 has $d_c(j)$ edges (shown as $d_c$ 464) connecting this node to one or more of the variable nodes (or bit nodes) 461. This number of edges, $d_c$ 464, may be referred to as the degree of the check node j.

An edge 467 between a variable node $v_i$ (or bit node $b_i$) 465 and check node $c_j$ 466 can be defined by e=(i,j). Alternatively, given an edge e=(i,j), the nodes of the edge may alternatively be denoted as by e=(v(e),c(e)) (or e= (b(e),c(e)). The edges in the graph correspond to the set elements of H where a set element $h_{ji}$ indicates that an edge connects a bit (e.g., variable) node i with parity check node j.

Given a variable node $v_i$ (or bit node $b_i$), one may define the set of edges emitting from the node $v_i$ (or bit node $b_i$) by $E_v(i)=\{e|v(e)=i\}$ (or by $E_b=\{e|b(e)=i\}$); these edges are referred to as bit edges, and the messages corresponding to these bit edges are referred to as bit edge messages.

Given a check node one may define the set of edges emitting from the node $c_j$ by $E_c(j)=\{e|c(e)=j\}$; these edges are referred to as check edges, and the messages corresponding to these check edges are referred to as check edge messages. Continuing on, the derivative result will be $|E_v(i)|=d_v$ (or $|E_b(i)|=d_b$) and $|E_c(j)|=d_c$.

Generally speaking, any such codes (e.g., LDPC codes) that can be represented by a bipartite graph may be characterized as a graph code. It is also noted that an irregular LDPC code may also be described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not be equal to $|E_v(i_2)|$. This relationship may also hold true for more than one (e.g., two) check nodes.

Note that terminology such as that of "bit node" and "bit edge message", or equivalents thereof, may be used in the art of LDPC decoding. With respect to LDPC decoding, note that "bit node" and "bit edge message" are alternatively referred to as "variable node" and "variable edge message", respectively. Note that LDPC decoding operates to make one or more estimates of the bit values (or variable values) encoded within an LDPC coded signal.

FIG. 4B illustrates an example 402 of decoding of an LDPC coded signal. Within a communication device (e.g., communication device 110), a signal received from a communication channel undergoes appropriate demodulation (e.g., processing within an analog front end including digital sampling, digital to analog conversion, filtering, frequency conversion (up or down), gain adjustment and/or scaling, etc.) to generate a received bit sequence. Then, a metric generator 471 calculates log-likelihood ratios (LLRs) for each bit location within the received bit sequence. These LLRs correspond initially to the bit nodes 461 of the LDPC code and its corresponding LDPC bipartite graph that represents the LDPC matrix used to decode the signal.

In an example of LDPC decoding, during initialization, the LLRs are employed for the bit edge messages (e.g., extrinsic information) of the edges extending from the respective bit/variable nodes. Thereafter, one or more decoding cycles or iterations may be performed based on check node processing and bit node processing (iterative decoding 472). Check node processing or check node updating is performed using the original bit edge messages (e.g., the calculated LLRs) such as by a check node processor 474. A bit/variable node processor 473 then uses these updated check edge messages to perform bit node processing or bit node updating to update the variable node soft information for use in the next decoding iteration. The most recently updated variable bit/node soft information is then used to calculate the variable node edge messages (extrinsic information) for this next decoding iteration. The check node processor 474 performs check message updating (based on rows of the LDPC matrix) to generate updated check edge messages, and the bit/variable node processor 473 performs bit or variable edge message updating (based on columns of the LDPC matrix) as also described with reference to FIG. 4A.

When more than one decoding iteration is performed, these variable node edge messages are then used by the check node processor 474 for subsequent check node processing or check node updating to calculate updated check edge messages. Then, bit/variable node processor 473 uses the most recently updated check edge messages to perform bit node processing or bit node updating to update the variable node soft information once again. After a final decoding iteration, which may be determined based on some parameter (e.g., a predetermined number of decoding iterations or when all syndromes of the LDPC code equal zero, as determined by syndrome calculator 476), the last calculated variable node soft information may undergo hard limiting (e.g., in a slicer or hard limiter 475) to generate one or more estimates of one or more bits encoded within the LDPC coded signal.

Generally speaking, this approach for decoding of LDPC coded signals may be referred to as a message passing approach (or iterative message passing approach). Note that LDPC decoding may be performed in any of a variety of architectures including parallel decoding architectures, layer decoding architectures etc. Device 110 may be implemented to perform encoding and/or decoding of LDPC coded signal using any desired approach or architecture.

Note that the various functional blocks and components depicted in FIG. 1B may be implemented or performed by the processor 130 (and memory 140) of communication device 110 or alternatively, processor 130a. For example, the processor 130 can be implemented to perform such decoding operations and the memory 140 can be implemented to store and perform memory management for the various bit/variable and check edge messages, variable bit/node soft information, extrinsic information, etc. used in the decoding operations.

FIG. 4C illustrates an example 403 of an LDPC matrix that is partitioned into sub-matrices. This diagram shows the relationship between an overall LDPC matrix and the individual sub-matrices therein that can be all zero-valued sub-matrices and/or CSI (Cyclic Shifted Identity) sub-matrices, and the diagram shows the sub-matrix rows and sub-matrix columns of the LDPC matrix that correspond to the sub-matrix arrangement of the LDPC matrix. Note also that a generator matrix, corresponding to an LDPC matrix, may be employed to encode at least one information bit to generate a plurality of LDPC coded bits and/or an LDPC codeword (e.g., such as using back-substitution described below). A generator matrix, G, of an LDPC code has the following relationship with LDPC matrix, H: $GH^T=0$. An LDPC code may be defined or characterized by its LDPC matrix, H, and/or its generator matrix, G.

A processor of a communication device (e.g., processor 330 of communication device 110) may be configured to encode at least one information bit to generate the plurality of LDPC coded bits and/or an LDPC codeword. The processor then transmits the plurality of LDPC coded bits and/or the LDPC codeword, within an LDPC coded signal via a communication interface (e.g., communication interface 120 of communication device 110). The processor may be configured to generate the LDPC coded signal by appropriate modulation of the plurality of LDPC coded bits and/or the LDPC codeword (e.g., processing within an analog front end including digital to analog conversion, filtering, frequency conversion (up or down), gain adjustment, etc.).

A binary LDPC code may be fully described by its parity check matrix (i.e., its LDPC matrix). At the top of the diagram, the individual elements of an LDPC matrix, H, are shown:

$$H = \begin{bmatrix} h_{0,0} & h_{0,1} & \cdots & h_{0,n-1} \\ h_{1,0} & h_{1,1} & \cdots & h_{1,n-1} \\ \cdots & \cdots & \cdots & \cdots \\ h_{m-1,0} & h_{m-1,1} & \cdots & h_{m-1,n-1} \end{bmatrix}$$

where n is the number of bits in a codeword, m is the number of parity check equations of the LDPC code, and $h_{i,j}$ is either 0 or 1. An n-bit vector c (e.g., $c=(c_1, c_2, \ldots, c_N)$) is a codeword (i.e., of the LDPC code) if and only if $Hc^T=0$.

For such an LDPC code, the parity matrix H is also composed of a number of q-by-q (i.e., q×q) square sub-matrices as shown in the bottom portion of the diagram and also below:

$$H = \begin{bmatrix} S_{0,0} & S_{0,1} & \cdots & S_{0,N-1} \\ S_{1,0} & S_{1,1} & \cdots & S_{1,N-1} \\ \cdots & \cdots & \cdots & \cdots \\ S_{M-1,0} & S_{M-1,1} & \cdots & S_{M-1,N-1} \end{bmatrix}$$

where M=m/q, N=n/q, and each sub-matrix, $S_{I,J}$, thereof is a q-by-q sub-matrix that is either an all-zero-valued sub-matrix (i.e., in which all elements thereof are the value of zero "0", which is depicted by a blank or an empty sub-matrix or a sub-matrix with value of "−1" therein in the associated diagrams) or a CSI (Cyclic Shifted Identity) sub-matrix. A CSI sub-matrix S is characterized by a shift-value, $\lambda(S)$, (e.g., a right shift value) such that the components of S are defined as follows:

$$s_{i,j} = \begin{cases} 1 & \text{if } i + \lambda(S) = j \pmod{q} \\ 0 & \text{otherwise} \end{cases}$$

for any i and j, with $0 \le i < q$ and $0 \le j < q$. For example, the q-by-q identity matrix is itself a CSI matrix with a shift-value $\lambda(S)=0$ (i.e., a CSI sub-matrix with a cyclic shift of zero "0").

As can be seen, the LDPC matrix (as depicted in the lower portion of the diagram), includes various sub-matrix rows and sub-matrix columns. These sub-matrix rows and columns are based on the sub-matrix construction of the LDPC matrix (e.g., shown as sub-matrix rows 0 through M−1 and sub-matrix columns 0 through N−1). This disclosure presents various new designs of LDPC codes.

Note also the following with respect to such LDPC code matrix constructions. A given LDPC code may be a QC (quasi-cyclic)-LDPC code. The definition of such an (n, k) QC-LDPC code is provided as follows:

1. (n−k)-by-n parity check matrix H
2. H is expanded from a binary base matrix $H_b$ of size v-by-u
3. The base matrix $H_b$ is expanded by replacing each sub-matrix in the base matrix with a size z permutation matrix, and each a blank, 0, or "−1" negative with a size z zero matrix (e.g., with all zero-valued elements). The permutations used are circular right shifts as described above, and the set of permutation sub-matrices contains the size z identity matrix and circular right shifted versions of the identity matrix (i.e., CSI sub-matrices).

Because each permutation matrix is specified by a single circular right shift, the binary base matrix information and permutation replacement information can be combined into a single compact model matrix $H_{bm}$. The model matrix $H_{bm}$ is the same size as the binary base matrix $H_b$, with each binary entry (i,j) of the base matrix $H_b$ replaced to create the model matrix $H_{bm}$. Each 0 in $H_b$ is replaced by a blank or "−1" negative to denote a size z all-zero matrix, and each other sub-matrix in $H_b$ is replaced by a circular shift size $p(i,j) \ge 0$ (e.g., an entry of "−1" indicates an all-zero-valued sub-matrix, and any other entry such as 0, 1, 2, etc. indicates an identity sub-matrix (if entry is 0), a CSI sub-matrix based on a shift-value of 1 (if entry is 1), a CSI sub-matrix based on a shift-value of 2 (if entry is 2), etc. and so on for any desired cyclic shift-value). The model matrix $H_{bm}$ can then be directly expanded to the entire LDPC matrix, H.

Note that this binary base matrix $H_b$ to generate the parity check matrix, H, may be referred to as lifting. The lifting factor corresponds to the size of the square sub-matrices (e.g., lifting factor of z when each sub-matrix in the base matrix with a size z permutation matrix). Generally, note that a permutation matrix (or sub-matrix), circulant permutation sub-matrix (or sub-matrix), a circulant permutation matrix (or sub-matrix), etc. maybe used to identify such a square matrix (or sub-matrix) that is an identity matrix (or sub-matrix) or a CSI matrix (or sub-matrix) of any desired size.

Note that any of various size and types of LDPC matrices may be used for various communications and by various communication devices. In one example, an LDPC matrix includes 3 sub-matrix rows and 24 sub-matrices columns, the sub-matrices thereof include 81×81 size sub-matrices (e.g., include a lifting factor (LF) of 81), and the LDPC code is a rate 7/8 LDPC code having a codeword size of 1944 bits. In another example, an LDPC matrix includes 6 sub-matrix rows and 48 sub-matrices columns, the sub-matrices thereof include 81×81 size sub-matrices (e.g., include a lifting factor (LF) of 81), and the LDPC code is a rate 7/8 LDPC code having a codeword size of 3888 bits.

FIG. 5A is a diagram illustrating an example 501 of an LDPC matrix partitioned into a left hand side matrix and a right hand side matrix. The parity matrix H of the bottom of FIG. 4C may be partitioned into a left hand side matrix, $H_{LHS}$, and a right hand side matrix, $H_{RHS}$. The partitioning will be in between two sub-matrix columns. This diagram shows the partitioning being between sub-matrix column x−1 and sub-matrix column x. Left hand side matrix, $H_{LHS}$, and right hand side matrix, $H_{RHS}$, include the same number of sub-matrix rows. In one implementation, the right hand side matrix, $H_{RHS}$, is a square matrix that includes a same number of sub-matrix rows and sub-matrix columns (e.g., the right hand side matrix, $H_{RHS}$, may generally be of any size such as z-by-z, where z is any desired number such as 2, 3, 4, 5, 6, 7, or even higher numbers etc.).

FIG. 5B is a diagram illustrating examples 502 of right hand side matrices of LDPC matrices. The parity matrix H includes of sub-matrices arranged as a left hand side matrix, $H_{LHS}$, and a right hand side matrix, $H_{RHS}$. This diagram shows examples of the right hand side matrix, $H_{RHS}$. The right hand side matrix, $H_{RHS}$, includes all-zero-valued sub-matrices except for a plurality of CSI (Cyclic Shifted Identity) sub-matrices located on a main diagonal of the right hand side matrix and another diagonal that is adjacently located to right of the main diagonal of the right hand side matrix as shown in the diagram.

In some examples, the right hand side matrix, $H_{RHS}$, includes all-zero-valued sub-matrices except for CSI (Cyclic Shifted Identity) sub-matrices located on a main diagonal of the right hand side matrix, and another diagonal that is adjacently located to right of the main diagonal, and optionally certain one or more sub-matrices located below and to the left of the main diagonal. The right hand side matrix, $H_{RHS}$, includes first all-zero-valued sub-matrices located above and to the right of the other diagonal that is adjacently located to right of the main diagonal. First CSI (Cyclic Shifted Identity) sub-matrices are located on the main diagonal of the right hand side matrix, and second CSI sub-matrices and/or second all-zero-valued sub-matrices are located along the other diagonal that is adjacently located to right of the main diagonal. Those sub-matrices located below and to the left of the main diagonal of the right hand side matrix are depicted in the diagram as "C/-1" since each of them may be either a CSI sub-matrix or an all-zero-valued sub-matrix. Note that all of them may be all-zero-valued sub-matrices or one or more of them may be CSI sub-matrices with the remaining of them all-zero-valued sub-matrices, etc.

Note also that such CSI sub-matrices may be based on different CSI values. A CSI value of zero (0) indicates an identity sub-matrix (e.g., with no cyclic shift performed therein). A CSI value of 1 indicates an identity sub-matrix that has undergone a cyclic shift by 1. Any desired CSI value may be employed up to the sub-matrix size, z, if considering sub-matrices of size z-by-z. Generally speaking, a CSI value of x indicates an identity sub-matrix that has undergone a cyclic shift by x.

While examples have been provided showing LDPC decoding, any of the communication devices herein (e.g., using a processor 130 and/or communication interface (or solely a processor) therein may also be configured to perform encoding of bit(s) to generate LDPC coded bit(s) and/or LDPC codeword(s). Such encoding maybe performed using back-substitution. An LDPC matrix may be partitioned into a left hand side matrix, $H_{LHS}$, and a right hand side matrix, $H_{RHS}$, such as shown in FIG. 5A. The right hand side matrix, $H_{RHS}$, can have the form of any of the right hand side matrices of FIG. 5B, and may be of any desired size such as 3-by-3, 4-by-4, 5-by-5, or generally of any size such as z-by-z, where z is any desired number such as 2, 3, 4, 5, 6, 7, etc.

Considering a right hand side matrix, $H_{RHS}$, having the form of those in FIG. 5B, a CSI sub-matrix may be a respective identity matrix that has either not been cyclic shifted (and remains an identity matrix) or a respective identity matrix that has been cyclic shifted by some amount as described above. For sub-matrices of size, L-by-L, input (information) bits, $c_{in}$ (k bits=L(n−m) bits), may be represented as follows: $c_{in}=(c_0, c_1, \ldots, c_{k-1})$.

In an example of operation, a communication device then encodes the input (information) bits and computes L·m parity bits, $c_{par}$ (e.g., LDPC coded bits) as follows: $c_{par}=(c_k, c_{k+1}, \ldots, c_{Ln-1})$ The processor and/or communication interface (or simply processor) of the communication device then outputs the following:

$$c_P^T = \begin{pmatrix} C_0 \\ C_1 \\ C_2 \\ C_3 \\ C_4 \end{pmatrix},$$

where $C_i=(c_{L(n-m+i)}, c_{L(n-m+i)+1}, \ldots, c_{L(n-m+i)+L-1})^T$.

For a right hand side matrix, $H_{RHS}$, in the form of those in FIG. 5B being of size 5-by-5 (e.g., where i varies from 0 to 4 in order of 0, 1, 2, 3, 4).

The encoding procedure may be described as follows:
Input: $c_1=(c_0, c_1, \ldots, c_{k-1})$
Step 1: compute $V_i=H_{1,i}c_1^T$, such that $i=0, \ldots, 4$.
Step 2: back-substitution
$C_0=V_0(L-u_{0,0})$
$C_1=V_1(L-u_{1,1})+C_0((L+u_{1,1}+u_{1,0}) \bmod L)$
$C_2=V_2(L-u_{2,2})+C_1((L-u_{2,2}+u_{2,1}) \bmod L)$
$C_3=V_3(L-u_{3,3})+C_2((L-u_{3,3}+u_{3,2}) \bmod L)$
$C_4=V_4(L-u_{4,4})+C_3((L-u_{4,4}+u_{4,3}) \bmod L)$
Output:

$$c_P^T = \begin{pmatrix} C_0 \\ C_1 \\ C_2 \\ C_3 \\ C_4 \end{pmatrix}$$

Note that this approach shows just one possible example by which encoding based on an LDPC code may be performed. Generally, the decoding operations described herein may be performed on an LDPC coded signal that is generated using any LDPC encoding approach.

FIG. 5C is a diagram illustrating another example 503 of an LDPC matrix partitioned into a left hand side matrix and a right hand side matrix. In this diagram, an LDPC code used by a device is a systematic code such that the left hand side matrix of the LDPC matrix of the LDPC code corresponds to the information and the right hand side matrix of the LDPC matrix of the LDPC code corresponds to parity check. In some examples, the variable node degree of columns (e.g., columns or sub-matrix columns) of the left hand side matrix is 3. In certain other examples, columns thereof of the left hand side matrix have different variable node degrees (e.g., degree of 4 for $1^{st}$ column and/or sub-matrix column, degree of 3 for $2^{nd}$ column and/or sub-matrix column, and/or generally any desired variation of variable node degree of the various columns and/or sub-matrices columns of the left hand side matrix).

FIG. 6A is a diagram illustrating an example 601 of a communication device configured to perform LDPC encoding and puncturing. A forward error correction (FEC) encoder 620 processes information bits to generate coded bits. In the context of LDPC encoding, encoder 620 employs a generator matrix that is based on a given LDPC code that may also be characterized as described herein. For example, the LDPC matrix may be viewed as being composed of a left hand side matrix and a right hand side matrix as described herein.

A puncturer 630 punctures one or more subsets of information bits and one or more subsets of parity bits from the coded bits generated by the FEC encoder 620 to generate one or more codewords. These subsets of information bits and parity bits may be groups of contiguous bits within the coded bits. For example, a first contiguous subset of information bits (e.g., having a first period) may be punctured, and a contiguous subset of parity bits may be punctured (e.g., having the first or a second period). In other examples, more than one contiguous subset may be punctured from the coded bits (e.g., two or more contiguous subsets of information bits may be punctured, and two or more contiguous subsets of parity bits may be punctured). In even other examples, different numbers of subsets of bits may be punctured from the information bits and the parity bits (e.g., one subset of bits punctured from information bits, and to subsets of bits punctured from the parity bits). Such puncturing may be performed using different periods of bits, and/or different starting locations within the coded bits.

A transmit (TX) driver 690 processes the one or more codewords to generate one or more continuous-time signals for transmission to one or more other devices via one or more communication channels. The TX driver 690 may perform operations such as those of an analog front end (AFE) of a communication device (e.g., digital to analog conversion, frequency conversion such as conversion, scaling, filtering, etc.). Generally, the TX driver 690 operates to generate a signal suitable for transmission from the communication device.

FIG. 6B is a diagram illustrating an example 602 of a communication device configured to perform bit filling, LDPC encoding, shortening, and puncturing. The example 602 has some similarity to the example 601 of FIG. 6A with differences being that a bit filler 605 operates to add one or more zero-valued bits to the incoming information bits before encoding by the FEC encoder 620. After FEC encoding, a shortener 625 operates to remove those zero-valued bits that were added to the information bit before undergoing FEC encoding. The other components (420, 630, and 690) in the example 602 generally operate similarly as within example 601 of FIG. 6A.

Note that the operations of the various functional blocks, components, etc. within FIG. 6A and FIG. 6B may be performed within communication device 110. For example, communication interface 320 of device 110 (or communication interface 320-1 of WDEV 310) may be configured to perform the operations of the transmit (TX) driver 690. The processor 130 of device 110 may be configured to perform bit filling, LDPC encoding, shortening, puncturing, and/or other related operations.

Note that alternative approaches that generate an LDPC coded signal based on puncturing of one or more bits from another LDPC coded signal may be used. Regardless of the particular manner by which an LDPC coded signal is generated, a device that operates using the various principles described herein can effectively be code that LDPC coded signal based on a modified or effective LDPC matrix generated from another LDPC matrix that corresponds to the other LDPC coded signal.

FIG. 6C is a diagram illustrating examples 603 of right hand side matrices of LDPC matrices. Various structures of right hand side matrices, $H_{RHS}$, of LDPC matrices are shown in this diagram. These right hand side matrices are square (e.g., include a same number of sub-matrix rows and sub-matrix columns, e.g., n sub-matrix columns and n sub-matrix rows, where n is a positive integer). An entry of 1 in a sub-matrix indicates a CSI sub-matrix having a cyclic shift value of 1. An entry of 0 in a sub-matrix indicates a CSI sub-matrix having a cyclic shift value of 0, thereby making such a CSI sub-matrix to be an identity sub-matrix. A sub-matrix with no label therein indicates an all-zero-valued sub-matrix.

Such right hand side matrices, $H_{RHS}$, include all-zero-valued sub-matrices except for CSI (Cyclic Shifted Identity) sub-matrices located on a main diagonal of the right hand side matrix and another diagonal that is adjacently located to right of the main diagonal of the right hand side matrix and two other CSI sub-matrices located on a left hand most column of the right hand side matrix. Note that all of these CSI sub-matrices (along the main diagonal and the other adjacently located diagonal) are identity sub-matrices except for a first CSI sub-matrix with cyclic shift value of 1 that is located at a top of the main diagonal and a top of left hand most column of the right hand side matrix, a second CSI sub-matrix with cyclic shift value of 1 that is located at a bottom of the left hand most column of the right hand side matrix. Note that a third CSI sub-matrix with cyclic shift value of 0 (i.e., being an identify sub-matrix) is located on the left hand most column of the right hand side matrix and in between the first CSI sub-matrix and the second CSI sub-matrix.

The particular location of this third CSI sub-matrix is based on the size of the right hand side matrix, $H_{RHS}$. When the right hand side matrix, $H_{RHS}$, is 4×4 (e.g., such as corresponding to a rate 5/6 LDPC code), then the third CSI sub-matrix is located at the $2^{nd}$ from bottom sub-matrix row in the left hand most sub-matrix column as shown in the diagram. When the right hand side matrix, $H_{RHS}$, is 6×6 (e.g., such as corresponding to a rate 5/6 LDPC code), then the third CSI sub-matrix is located at the $3^{rd}$ from bottom sub-matrix row in the left hand most sub-matrix column as shown in the diagram. When the right hand side matrix, $H_{RHS}$, is 8×8 (e.g., such as corresponding to a rate 5/6 LDPC code), then the third CSI sub-matrix is located at the $4^{th}$ from bottom sub-matrix row in the left hand most sub-matrix column as shown in the diagram. When the right hand side matrix, $H_{RHS}$, is 12×12 (e.g., such as corresponding to a rate 5/6 LDPC code), then the third CSI sub-matrix is located at the $6^{th}$ from bottom sub-matrix row in the left hand most sub-matrix column as shown in the diagram. This design principle may be extended to any sized right hand side matrix, $H_{RHS}$, that include a same number of sub-matrix rows and sub-matrix columns (e.g., n sub-matrix columns and n sub-matrix rows, where n is a positive integer).

Certain LDPC codes may have LDPC matrices that have format as presented in this diagram. The codeword size may be 1944 bits for certain LDPC codes. Such LDPC codes having this format may be used in any of the various communication systems, communication devices, etc. presented herein or their equivalents. The code rates of the LDPC codes associated with the right hand side matrices, $H_{RHS}$, as shown in this diagram are, from left to right, ½, ⅔, ¾ and ⅚. The structure of parity-check matrices is as follows:

Lifting factor (LF)/sub-matrix size: 81 (e.g., the sub-matrices have size 81×81)

Sub-matrix (SM) is cyclic shifted identity matrix (CSIM) (e.g., an identify sub-matrix that has undergone a cyclic shift).

Sub-matrix columns: 24 Sub-matrix rows: 12 for rate ½, 8 for rate ⅔, 6 for rate ¾ and 4 for rate ⅚

Style of the parity part of the parity check matrix (e.g., the right hand side matrices, $H_{RHS}$) is shown in the diagram for various code rates.

FIG. 7A is a diagram illustrating an example 701 of orthogonal frequency division multiplexing (OFDM) and/or orthogonal frequency division multiple access (OFDMA). OFDM's modulation may be viewed as dividing up an available spectrum into a plurality of narrowband sub-carriers (e.g., relatively lower data rate carriers). The sub-carriers are included within an available frequency spectrum portion or band. This available frequency spectrum is divided into the sub-carriers or tones used for the OFDM or OFDMA symbols and packets/frames. Note that sub-carrier or tone may be used interchangeably. Typically, the frequency responses of these sub-carriers are non-overlapping and orthogonal. Each sub-carrier may be modulated using any of a variety of modulation coding techniques (e.g., as shown by the vertical axis of modulated data).

A communication device may be configured to perform encoding of one or more bits to generate one or more coded bits used to generate the modulation data (or generally, data). For example, a processor and the communication interface of a communication device may be configured to perform forward error correction (FEC) and/or error checking and correction (ECC) code of one or more bits to generate one or more coded bits. Examples of FEC and/or ECC may include turbo code, convolutional code, turbo trellis coded modulation (TTCM), low density parity check (LDPC) code, Reed-Solomon (RS) code, BCH (Bose and Ray-Chaudhuri, and Hocquenghem) code, binary convolutional code (BCC), Cyclic Redundancy Check (CRC), and/or any other type of ECC and/or FEC code and/or combination thereof, etc. Note that more than one type of ECC and/or FEC code may be used in any of various implementations including concatenation (e.g., first ECC and/or FEC code followed by second ECC and/or FEC code, etc. such as based on an inner code/outer code architecture, etc.), parallel architecture (e.g., such that first ECC and/or FEC code operates on first bits while second ECC and/or FEC code operates on second bits, etc.), and/or any combination thereof. The one or more coded bits may then undergo modulation or symbol mapping to generate modulation symbols. The modulation symbols may include data intended for one or more recipient devices. Note that such modulation symbols may be generated using any of various types of modulation coding techniques. Examples of such modulation coding techniques may include binary phase shift keying (BPSK), quadrature phase shift keying (QPSK), 8-phase shift keying (PSK), 16 quadrature amplitude modulation (QAM), 32 amplitude and phase shift keying (APSK), etc., uncoded modulation, and/or any other desired types of modulation including higher ordered modulations that may include even greater number of constellation points (e.g., 1024 QAM, etc.).

FIG. 7B is a diagram illustrating another example 702 of OFDM and/or OFDMA. A transmitting device transmits modulation symbols via the sub-carriers. Note that such modulation symbols may include data modulation symbols, pilot modulation symbols (e.g., for use in channel estimation, characterization, etc.) and/or other types of modulation symbols (e.g., with other types of information included therein). OFDM and/or OFDMA modulation may operate by performing simultaneous transmission of a large number of narrowband carriers (or multi-tones). In some applications, a guard interval (GI) or guard space is sometimes employed between the various OFDM symbols to try to minimize the effects of ISI (Inter-Symbol Interference) that may be caused by the effects of multi-path within the communication system, which can be particularly of concern in wireless communication systems. In addition, a cyclic prefix (CP) and/or cyclic suffix (CS) (shown in right hand side of FIG. 7A) that may be a copy of the CP may also be employed within the guard interval to allow switching time (e.g., such as when jumping to a new communication channel or sub-channel) and to help maintain orthogonality of the OFDM and/or OFDMA symbols. Generally speaking, an OFDM and/or OFDMA system design is based on the expected delay spread within the communication system (e.g., the expected delay spread of the communication channel).

In a single-user system in which one or more OFDM symbols or OFDM packets/frames are transmitted between a transmitter device and a receiver device, all of the sub-carriers or tones are dedicated for use in transmitting modulated data between the transmitter and receiver devices. In a multiple user system in which one or more OFDM symbols or OFDM packets/frames are transmitted between a transmitter device and multiple recipient or receiver devices, the various sub-carriers or tones may be mapped to different respective receiver devices as described below with respect to FIG. 7C.

FIG. 7C is a diagram illustrating another example 703 of OFDM and/or OFDMA. Comparing OFDMA to OFDM, OFDMA is a multi-user version of the popular orthogonal frequency division multiplexing (OFDM) digital modulation scheme. Multiple access is achieved in OFDMA by assigning subsets of sub-carriers to individual recipient devices or users. For example, first sub-carrier(s)/tone(s) may be assigned to a user 1, second sub-carrier(s)/tone(s) may be assigned to a user 2, and so on up to any desired number of users. In addition, such sub-carrier/tone assignment may be dynamic among different respective transmissions (e.g., a first assignment for a first packet/frame, a second assignment for second packet/frame, etc.). An OFDM packet/frame may include more than one OFDM symbol. Similarly, an OFDMA packet/frame may include more than one OFDMA symbol. In addition, such sub-carrier/tone assignment may be dynamic among different respective symbols within a given packet/frame or superframe (e.g., a first assignment for a first OFDMA symbol within a packet/frame, a second assignment for a second OFDMA symbol within the packet/frame, etc.). Generally speaking, an OFDMA symbol is a particular type of OFDM symbol, and general reference to OFDM symbol herein includes both OFDM and OFDMA symbols (and general reference to OFDM packet/frame herein includes both OFDM and OFDMA packets/frames, and vice versa). FIG. 7C shows example 703 where the assignments of sub-carriers to different users are intermingled among one another (e.g., sub-carriers assigned to a first user includes non-adjacent sub-carriers and at least one sub-carrier assigned to a second user is located in between two sub-carriers assigned to the first user). The different groups of sub-carriers associated with each user may be viewed as being respective channels of a plurality of channels that compose all of the available sub-carriers for OFDM signaling.

FIG. 7D is a diagram illustrating another example 704 of OFDM and/or OFDMA. In this example 704, the assignments of sub-carriers to different users are located in different groups of adjacent sub-carriers (e.g., first sub-carriers assigned to a first user include first adjacently located sub-carrier group, second sub-carriers assigned to a second user include second adjacently located sub-carrier group, etc.). The different groups of adjacently located sub-carriers associated with each user may be viewed as being respective channels of a plurality of channels that compose all of the available sub-carriers for OFDM signaling.

FIG. 7E is a diagram illustrating an example 705 of single-carrier (SC) signaling. SC signaling, when compared to OFDM signaling, includes a singular relatively wide channel across which signals are transmitted. In contrast, in OFDM, multiple narrowband sub-carriers or narrowband sub-channels span the available frequency range, bandwidth, or spectrum across which signals are transmitted within the narrowband sub-carriers or narrowband sub-channels.

Generally, a communication device may be configured to include a processor and the communication interface (or alternatively a processor, such a processor 330a shown in FIG. 3A or a processor 330a-1 shown in FIG. 3B) configured to process received OFDM and/or OFDMA symbols and/or frames (and/or SC symbols and/or frames) and to generate such OFDM and/or OFDMA symbols and/or frames (and/or SC symbols and/or frames). Such OFDM related signals may be LDPC coded signals based on any of the various embodiments, examples, etc. described herein.

Note that the various communication devices as described herein and their equivalents may be configured to generate signals using any of the various LDPC codes as described herein and their equivalents, any OFDM/OFDMA signaling scheme as described herein and their equivalents, and/or using any desired modulation as described herein and their equivalents.

FIG. 8 is a diagram illustrating various examples 800 of LDPC matrices. The top three LDPC matrices, H1, H2, and H3, shown in this diagram correspond to rate ⅞ LDPC base matrices for three respective block lengths. The LDPC matrix, H1, corresponds to a block length/codeword size of 1944 bits corresponding to a lifting factor (LF) of 81 (e.g., such that the LDPC matrix, H2, includes 81×81 sub-matrices therein and includes 24 sub-matrix rows and 3 sub-matrix columns.

The LDPC matrix, H2, corresponds to a block length/codeword size of 1296 bits corresponding to a LF of 54 (e.g., such that the LDPC matrix, H2, includes 54×54 sub-matrices therein and includes 24 sub-matrix rows and 3 sub-matrix columns.

The LDPC matrix, H3, corresponds to a block length/codeword size of 648 bits corresponding to a LF of 27 (e.g., such that the LDPC matrix, H3, includes 27×27 sub-matrices therein and includes 24 sub-matrix rows and 3 sub-matrix columns.

The LDPC matrix, H4, at the bottom of the diagram, has the following properties. LF: 81, Number of sub-matrix (SM) columns: 24, Number of SM rows: 3.

Note that this may cause unsatisfied waterfall slop due to column degree ≤3

With respect to performance requirement, a peak error rate can be achieved of PER ≤1e-2 over IEEE nB and nD channel. The LDPC matrix (e.g., parity-check matrix) is shown in the diagram. Note that the number m represents: a 81×81 binary matrix obtained by right cyclic shifting m positions from the identity matrix '-': the all 0 entries 81×81 matrix. In some examples, the LDPC coded signal includes 16 bit symbols modulated using a 256 QAM modulation. In other examples, other sized symbols modulated using any other type of modulation may be used.

FIG. 9A is a diagram illustrating another example 901 of an LDPC matrix. The LDPC matrix, H5, of this diagram shows an LDPC matrix that undergoes or has undergone puncturing (shown by sub-matrix column enclosed in dotted line) of first 81 columns (one sub-matrix column). The column weight for rate 7/8 LDPC code is described with respect to this diagram. The codeword size is 1944 bits. This is obtained by puncturing a longer size LDPC code. This can be selected to have weight 4 columns in the parity check matrix.

This longer size code structure has the following properties. LF: 81, Number of SM columns: 25, Number of SM rows: 4 (note that this is different than the 3 sub-matrix row example above, H4, at the bottom of the diagram of FIG. 8). Puncturing is performed by puncturing of the first 81 columns of the actual LDPC matrix, H5 (e.g., one sub-matrix column). The resulting LDPC matrix (e.g., parity-check matrix) is shown in the diagram. In some examples, all columns of the parity/systematic portion of the LDPC matrix, H5, of this diagram have variable node degree of columns (e.g., columns or sub-matrix columns) of 3 except for the $1^{st}$/left hand most sub-matrix column has variable node degree of column (e.g., columns or sub-matrix columns) of 4.

FIG. 9B is a diagram illustrating another example 902 of an LDPC matrix. The size of the LDPC matrix of this diagram is doubled such that the doubling of the size for coding gain. The code structure of this diagram structure has the following properties. LF: 81, Number of SM columns: 48, Number of SM rows: 6, Codeword size: 2×1944=3888. The resulting LDPC matrix (e.g., parity-check matrix) is shown in the diagram.

Such LDPC codes may be applied and used for headers (e.g., headers of various packets and/or frames) in various communications.

Various possible information bits may be used for various applications (e.g., including header in such communications such as including some number of bits (e.g., 32 to 48 bits)). The code rate may be anywhere from ½ to ⅚. In some approaches, the header code may be implemented using BCC (binary convolutional code). In some other examples, a communication device may be implemented to apply short size LDPC code for header and other control channel FEC.

As one example, the IEEE 802.11ad standard uses rate 0.14 punctured and shortened LDPC code to protect 64 header bits for single carrier header. The IEEE 802.11ad standard also uses rate 0.095 punctured and shortened LDPC code to protect 64 header bits for OFDM header. As another example, Data Over Cable Service Interface Specification (DOCSIS) 3.1 uses rate ½ punctured and shortened LDPC code to protect 24 bits next code point, and it also uses other punctured and shortened LDPC code to protect physical link (e.g., physical layer (PHY)) channel and ranging.

Among possible applications, this disclosure presents a novel solution to apply LDPC code for header in some communications. This novel approach may be implemented and tailored for certain applications such as within the developing IEEE 802.11ax. This can provide a benefit of >1 dB performance. This can save cyclic redundancy check (CRC) and flushing bits used in BCC approaches. A communication device can be implemented to use LDPC code syndrome check to remove the need for a header CRC, and no flush tail bits are needed for LDPC codes.

FIG. 9C is a diagram illustrating examples 903 of various puncturing patterns. For a rate ⅚ puncturing pattern, 5 information data bits or symbols undergo encoding to generate 10 encoded data bits or symbols. Then, based on the puncturing pattern as shown on the left hand side (LHS) of the diagram, 4 of the encoded data bits or symbols are punctured and 6 encoded data bits or symbols remain thereby providing the rate 5/6 puncturing pattern.

For a rate 7/8 puncturing pattern, 7 information data bits or symbols undergo encoding to generate 14 encoded data bits or symbols. Then, based on the puncturing pattern as shown on the left hand side (LHS) of the diagram, 6 of the encoded data bits or symbols are punctured and 8 encoded data bits or symbols remain thereby providing the rate 7/8 puncturing pattern.

FIG. 10A is a diagram illustrating an embodiment of a method 1001 for execution by one or more wireless communication devices. The method 1001 begins by encoding information using a low density parity check (LDPC) code to generate an LDPC coded signal (block 1010).

In some examples, the LDPC code is characterized by an LDPC matrix that includes sub-matrices arranged as a left hand side matrix, $H_{LHS}$, and a right hand side matrix, $H_{RHS}$ (block 1012). In some examples, the right hand side matrix includes all-zero-valued sub-matrices except for CSI (Cyclic Shifted Identity) sub-matrices located on a main diagonal of the right hand side matrix, $H_{RHS}$, and another diagonal that is adjacently located to right of the main diagonal (block 1014). In some other examples, the right hand side matrix includes all-zero-valued sub-matrices except for CSI (Cyclic Shifted Identity) sub-matrices located on a main diagonal of the right hand side matrix, $H_{RHS}$, and another diagonal that is adjacently located to right of the main diagonal and one or more other CSI sub-matrices located on a left hand most column of the right hand side matrix, $H_{RHS}$ (block 1016). In certain examples, the left hand side matrix, $H_{LHS}$, corresponds to an information/systematic portion of the LDPC matrix, and columns thereof (e.g., individual columns and/or sub-matrices columns of the left hand side matrix, $H_{LHS}$) have variable node degree of 3 (block 1018). In certain other examples, columns thereof of the left hand side matrix, $H_{LHS}$, have different variable node degrees (e.g., degree of 4 for $1^{st}$ column and/or sub-matrix column, degree of 3 for $2^{nd}$ column and/or sub-matrix column, and/or generally any desired variation of variable node degree of the various columns and/or sub-matrices columns of the left hand side matrix, $H_{LHS}$).

The method 1001 continues by transmitting (e.g., via a communication interface of the communication device) the LDPC coded signal to another communication device (e.g., via one or more communication pathways within any one or more communication links, network segments, etc.) (block 1020).

FIG. 10B is a diagram illustrating another embodiment of a method 1002 for execution by one or more wireless communication devices. The method 1002 begins by receiving (e.g., via a communication interface of the communication device) an LDPC coded signal from another communication device (e.g., via one or more communication pathways within any one or more communication links, network segments, etc.) (block 1011). The method 1002 continues by decoding the LDPC coded signal using an LDPC matrix to generate one or more estimates of information encoded therein (block 1021).

In some examples, the LDPC matrix corresponds to an LDPC code, and the LDPC matrix includes sub-matrices arranged as a left hand side matrix, $H_{LHS}$, and a right hand side matrix, $H_{RHS}$ (block 1023). In some examples, the right hand side matrix includes all-zero-valued sub-matrices except for CSI (Cyclic Shifted Identity) sub-matrices located on a main diagonal of the right hand side matrix, $H_{RHS}$, and another diagonal that is adjacently located to right of the main diagonal (block 1025). In some other examples, the right hand side matrix includes all-zero-valued sub-matrices except for CSI (Cyclic Shifted Identity) sub-matrices located on a main diagonal of the right hand side matrix, $H_{RHS}$, and another diagonal that is adjacently located to right of the main diagonal and one or more other CSI sub-matrices located on a left hand most column of the right hand side matrix, $H_{RHS}$ (block 1025). In certain examples, the left hand side matrix, $H_{LHS}$, corresponds to an information/systematic portion of the LDPC matrix, and columns thereof (e.g., individual columns and/or sub-matrices columns of the left hand side matrix, $H_{LHS}$) have variable node degree of 3 (block 1027). In certain other examples, columns thereof of the left hand side matrix, $H_{LHS}$, have different variable node degrees (e.g., degree of 4 for $1^{st}$ column and/or sub-matrix column, degree of 3 for $2^{nd}$ column and/or sub-matrix column, and/or generally any desired variation of variable node degree of the various columns and/or sub-matrices columns of the left hand side matrix, $H_{LHS}$).

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to," "operably coupled to," "coupled to," and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to," "operable to," "coupled to," or "operably coupled to" indicates that an item includes one or more of power connections, input(s), output(s), etc., to perform, when activated, one or more its corresponding functions and may further include inferred coupling to one or more other items. As may still further be used herein, the term "associated with," includes direct and/or indirect coupling of separate items and/or one item being embedded within another item.

As may be used herein, the term "compares favorably" or equivalent, indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

As may also be used herein, the terms "processing module," "processing circuit," "processor," and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments of an invention have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality. To the extent used, the flow diagram block boundaries and sequence could have been defined otherwise and still perform the certain significant functionality. Such alternate definitions of both functional building blocks and flow diagram blocks and sequences are thus within the scope and spirit of the claimed invention. One of average skill in the art will also recognize that the functional building blocks, and other illustrative blocks, modules and components herein, can be implemented as illustrated or by discrete components, application specific integrated circuits, processors executing appropriate software and the like or any combination thereof.

The one or more embodiments are used herein to illustrate one or more aspects, one or more features, one or more concepts, and/or one or more examples of the invention. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module includes a processing module, a processor, a functional block, hardware, and/or memory that stores operational instructions for performing one or more functions as may be described herein. Note that, if the module is implemented via hardware, the hardware may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure of an invention is not limited by the particular examples disclosed herein and expressly incorporates these other combinations.

What is claimed is:

1. A communication device comprising:
   a communication interface; and
   processing circuitry that is coupled to the communication interface, wherein at least one of the communication interface or the processing circuitry configured to:
   puncture a sub-matrix column of a preliminary low density parity check (LDPC) matrix that has a variable node degree that is greater than other sub-matrix columns of the preliminary LDPC matrix to generate an LDPC matrix that includes a plurality of sub-matrices that are 81×81 size sub-matrices arranged as a left hand side matrix and a right hand side matrix, wherein the right hand side matrix includes all-zero-valued sub-matrices except for a plurality of CSI (Cyclic Shifted Identity) sub-matrices located on a main diagonal of the right hand side matrix and another diagonal that is adjacently located to right of the main diagonal of the right hand side matrix and two other CSI sub-matrices located on a left hand most column of the right hand side matrix, and wherein variable node degree of columns of the left hand side matrix is 3;
   encode information using an LDPC code that is a rate 7/8 LDPC code to generate an LDPC coded signal, wherein the LDPC code is characterized by the LDPC matrix; and
   transmit the LDPC coded signal to another communication device via a communication channel to be processed by the another communication device to decode the LDPC coded signal to generate estimates of the information encoded therein.

2. The communication device of claim 1, wherein the plurality of CSI sub-matrices includes identity sub-matrices except for a first CSI sub-matrix with cyclic shift value of 1 that is located at a top of the main diagonal and a top of left hand most column of the right hand side matrix, a second CSI sub-matrix with cyclic shift value of 1 that is located at a bottom of the left hand most column of the right hand side matrix, and a third CSI sub-matrix with cyclic shift value of 0 that is located on the left hand most column of the right hand side matrix and in between the first CSI sub-matrix and the second CSI sub-matrix.

3. The communication device of claim 1, wherein the LDPC code is a systematic code, the left hand side matrix corresponds to the information, and the right hand side matrix corresponds to parity check.

4. The communication device of claim 1, wherein:
the LDPC matrix includes 3 sub-matrix rows and 24 sub-matrices columns; and
the LDPC code having a codeword size of 1944 bits.

5. The communication device of claim 1, wherein:
the LDPC matrix includes 6 sub-matrix rows and 48 sub-matrices columns; and
the LDPC code having a codeword size of 3888 bits.

6. The communication device of claim 1, wherein the communication interface is further configured to support communications within at least one of a satellite communication system, a wireless communication system, a wired communication system, a fiber-optic communication system, or a mobile communication system.

7. The communication device of claim 1 further comprising:
a wireless communication device that includes a wireless station (STA), wherein the another communication device includes another wireless communication device that includes an access point (AP).

8. The communication device of claim 1 further comprising:
a wireless communication device that includes an access point (AP), wherein the another communication device includes another wireless communication device that includes a wireless station (STA).

9. A communication device comprising:
a communication interface; and
processing circuitry that is coupled to the communication interface, wherein at least one of the communication interface or the processing circuitry configured to:
puncture a sub-matrix column of a preliminary low density parity check (LDPC) matrix that has a variable node degree that is greater than other sub-matrix columns of the preliminary LDPC matrix to generate an LDPC matrix that includes a plurality of sub-matrices that are 81×81 size sub-matrices arranged as a left hand side matrix and a right hand side matrix, wherein the right hand side matrix includes all-zero-valued sub-matrices except for a plurality of CSI (Cyclic Shifted Identity) sub-matrices located on a main diagonal of the right hand side matrix and another diagonal that is adjacently located to right of the main diagonal of the right hand side matrix and two other CSI sub-matrices located on a left hand most column of the right hand side matrix, and wherein variable node degree of columns of the left hand side matrix is 3, wherein the plurality of CSI sub-matrices includes identity sub-matrices except for a first CSI sub-matrix with cyclic shift value of 1 that is located at a top of the main diagonal and a top of left hand most column of the right hand side matrix and a second CSI sub-matrix with cyclic shift value of 1 that is located at a bottom of the left hand most column of the right hand side matrix, and a third CSI sub-matrix with cyclic shift value of 0 that is located on the left hand most column of the right hand side matrix and in between the first CSI sub-matrix and the second CSI sub-matrix;
encode information using an LDPC code that is a rate 7/8 LDPC code to generate an LDPC coded signal, wherein the LDPC code is characterized by the LDPC matrix, wherein the LDPC code is a systematic code, the left hand side matrix corresponds to the information, and the right hand side matrix corresponds to parity check; and
transmit the LDPC coded signal to another communication device via a communication channel to be processed by the another communication device to decode the LDPC coded signal to generate estimates of the information encoded therein.

10. The communication device of claim 9, wherein:
the LDPC matrix includes 3 sub-matrix rows and 24 sub-matrices columns; and
the LDPC code having a codeword size of 1944 bits.

11. The communication device of claim 9, wherein:
the LDPC matrix includes 6 sub-matrix rows and 48 sub-matrices columns; and
the LDPC code having a codeword size of 3888 bits.

12. The communication device of claim 9, wherein the communication interface is further configured to support communications within at least one of a satellite communication system, a wireless communication system, a wired communication system, a fiber-optic communication system, or a mobile communication system.

13. The communication device of claim 9 further comprising:
a wireless communication device that includes a wireless station (STA), wherein the another communication device includes another wireless communication device that includes an access point (AP).

14. A method for execution by a communication device, the method comprising:
puncturing a sub-matrix column of a preliminary low density parity check (LDPC) matrix that has a variable node degree that is greater than other sub-matrix columns of the preliminary LDPC matrix to generate an LDPC matrix that includes a plurality of sub-matrices that are 81×81 size sub-matrices arranged as a left hand side matrix and a right hand side matrix, wherein the right hand side matrix includes all-zero-valued sub-matrices except for a plurality of CSI (Cyclic Shifted Identity) sub-matrices located on a main diagonal of the right hand side matrix and another diagonal that is adjacently located to right of the main diagonal of the right hand side matrix and two other CSI sub-matrices located on a left hand most column of the right hand side matrix, and wherein variable node degree of columns of the left hand side matrix is 3;
encoding information using an LDPC code that is a rate 7/8 LDPC code to generate an LDPC coded signal, wherein the LDPC code is characterized by the LDPC matrix; and
transmitting, via a communication interface of the communication device, the LDPC coded signal to another communication device via a communication channel to be processed by the another communication device to decode the LDPC coded signal to generate estimates of the information encoded therein.

15. The method of claim 14, wherein the plurality of CSI sub-matrices includes identity sub-matrices except for a first CSI sub-matrix with cyclic shift value of 1 that is located at a top of the main diagonal and a top of left hand most column of the right hand side matrix, a second CSI sub-matrix with cyclic shift value of 1 that is located at a bottom of the left hand most column of the right hand side matrix, and a third CSI sub-matrix with cyclic shift value of 0 that is located on the left hand most column of the right hand side matrix and in between the first CSI sub-matrix and the second CSI sub-matrix.

16. The method of claim 14, wherein the LDPC code is a systematic code, the left hand side matrix corresponds to the information, and the right hand side matrix corresponds to parity check.

17. The method of claim 14, wherein:
the LDPC matrix includes 3 sub-matrix rows and 24 sub-matrices columns; and
the LDPC code having a codeword size of 1944 bits.

18. The method of claim 14, wherein:
the LDPC matrix includes 6 sub-matrix rows and 48 sub-matrices columns; and
the LDPC code having a codeword size of 3888 bits.

19. The method of claim 14 further comprising:
operating the communication interface to support communications within at least one of a satellite communication system, a wireless communication system, a wired communication system, a fiber-optic communication system, or a mobile communication system.

20. The method of claim 14, wherein the communication device includes a wireless communication device that includes a wireless station (STA), and the another communication device includes another wireless communication device that includes an access point (AP).

* * * * *